(12) United States Patent
Musso et al.

(10) Patent No.: US 6,939,505 B2
(45) Date of Patent: Sep. 6, 2005

(54) METHODS FOR FORMING ARTICLES HAVING VERY SMALL CHANNELS THERETHROUGH, AND SUCH ARTICLES, AND METHODS OF USING SUCH ARTICLES

(75) Inventors: Christopher S. Musso, Concord, MA (US); Thomas W. Eagar, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 219 days.

(21) Appl. No.: 10/096,091

(22) Filed: Mar. 12, 2002

(65) Prior Publication Data

US 2003/0173720 A1 Sep. 18, 2003

(51) Int. Cl.[7] ............................. B28B 1/30; B28B 7/16
(52) U.S. Cl. ...................... 264/635; 264/629; 264/630; 264/125; 419/5
(58) Field of Search ........................ 264/39, 629, 630, 264/631, 125, 632, 635; 419/5

(56) References Cited

U.S. PATENT DOCUMENTS

3,502,755 A * 3/1970 Murray ........................ 264/633
3,992,202 A * 11/1976 Dulis et al. ..................... 419/5
4,261,745 A * 4/1981 Watanabe et al. ............... 419/8

OTHER PUBLICATIONS

Bowers, M. B. and Mudawar, I., "High flux boiling in low flow rate, low pressure drop mini–channel and micro–channel heat sinks," *Int. J. Heat Mass Transfer*, vol. 37, No. 2, pp. 321–332, 1994, Pergamon Press Ltd., Great Britain.

Bowers, Morris B., and Mudawar, Issam, "Two–Phase Electronic Cooling Using Mini–Channel and Micro–Channel Heat Sinks: Part 1 and Part 2," EEP–vol. 4–2, Advances in Electronic Packaging, ASME 1993, pp. 693–712.

Cole, Gregory S. and Scaringe, Robert P., "The Evolution of Microchannel Heat Transfer," SAE Technical Paper 1999–01–1357, pp. 9–13, 1999.

Davies, G. J. and Zhen, Shu, "Metallic foams: their production, properties and applications," *Journal of Materials Science* 18, 1983, pp. 1899–1911.

(Continued)

*Primary Examiner*—Steven P. Griffin
*Assistant Examiner*—Lisa L Herring
(74) *Attorney, Agent, or Firm*—Steven J. Weissburg

(57) ABSTRACT

Channeled articles having very small diameter channels spaced very closely can be made by packing elongated cores in a fixture, clamping them, and then introducing matrix material around the cores. The matrix material is formed into a unitary body and solidified. The cores are pulled out, leaving open channels where they had been. Some core and matrix combinations will permit the cores to be pulled out. Others require a core release coating to be applied to the cores. The cores can be metal or ceramic or polymer, and the matrix can be metal or ceramic or polymer. The cores can be solid, or hollow. Rather than pulling the cores out, if they are polymer, they can be burned out. The matrix can be formed by liquid state, solid state, or hybrid liquid/solid state techniques. A related technique uses hollow cores, which are not pulled out, but which remain in the body after unification. For such tube-walled articles, the matrix can be formed similarly. Rather than insuring core release, core retention is required. Such may occur due to the nature of the materials, or a specific core retention coating may be provided. Articles made of such material include heat sinks for semiconductor devices, light-weight structural components, thermally activated actuators, etc. Very small channel diameters and very large length to opening aspect ratios can be achieved. Heat exchange fluid can be compressed and pumped through such an article at very high efficiencies, to cool semiconductor devices.

48 Claims, 20 Drawing Sheets

OTHER PUBLICATIONS

Joo, Youngcheol, Dieu, Kiet and Kim, Chang–Jin, "Fabrication of Monolithic Microchannels for IC Chip Cooling," IEEE Micro Electro Mechanical Systems Workshop, Amsterdam, The Netherlands, Jan.–Feb. 1995.

McDanels, David L., "Tungsten Fiber Reinforced Copper Matrix Composites," NASA Technical Paper 2924, 1989.

Mortensen, Andreas and Cornie, James A., "On the Infiltration of Metal Matrix Composites," *Metallurgical Transactions A,* vol. 18A, Jun. 1987, pp. 1160–1163.

Mortensen, Andreas, Cornie, James A. and Flemings, Merton C., "Solidification Processing of Metal–Matrix Composites," *Journal of Metal,* Feb. 1988, pp. 12–19.

Rahman, Muhammed M. and Gui, Fulin, "Experimental Measurements of Fluid Flow and Heat Transfer in Microchannel Cooling Passages in a Chip Substrate," EEP–vol. 4–2, Advances in Electronic Packaging, ASME 1993, pp. 685–692.

Rohatgi, K., Asthana, R. and Das, S. "Solidification, structures, and properties of cast metal–ceramic particle composites," International Metal Reviews, 1986, vol. 31, No. 3, pp. 115–139.

Samalam, Vijay K., "Convective Heat Transfer in Microchannels," *Journal of Electronic Materials,* vol. 18, No. 5, 1989, pp. 611–617.

Shapovalov, Vladimir, "Porous Metals," *MRS (Materials Research Society) Bulletin,* Apr. 1994, pp. 24–28.

Smith, James P., "Heat Sink Offers Better Cooling," *Photonics Technology News,* Laurin Publishing Co. Inc., Jan. 2000.

Sokol, Irina V. and Sundukov, Alexey M., "Production of Metal–Matrix Composite Materials," Processing and Fabrication of Advanced Materials IV, The Minerals, Metal & Materials Society, 1996, pp. 491–498.

Tso, C.P. and Mahulikar, S.P., "Combined evaporating meniscus–driven convection and radiation in annular microchannels for electronics cooling application," International Journal of Heat and Mass Transfer, vol. 43, 2000, pp. 1007–1023, Pergamon Press.

Weisberg, Arel, Bau, Haim H. and Zemel, J. N., "Analysis of microchannels for integrated cooling," *Int. J. Heat Mass Transfer,* vol. 33, No. 10, pp. 2465–2474, 1992, Pergamon Press Ltd., Great Britain.

* cited by examiner

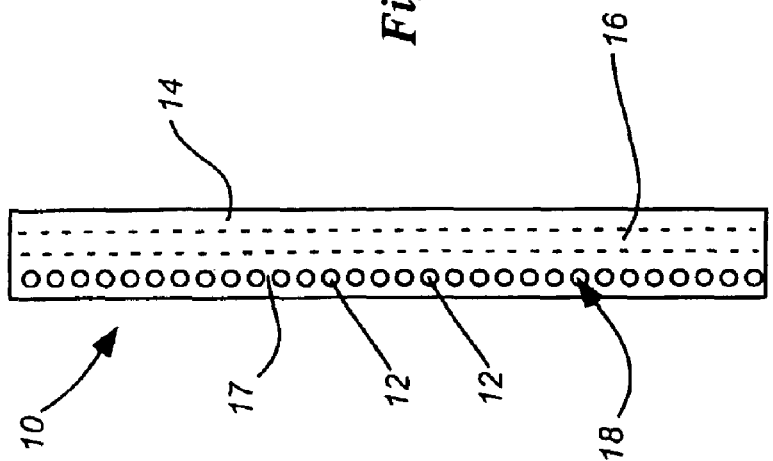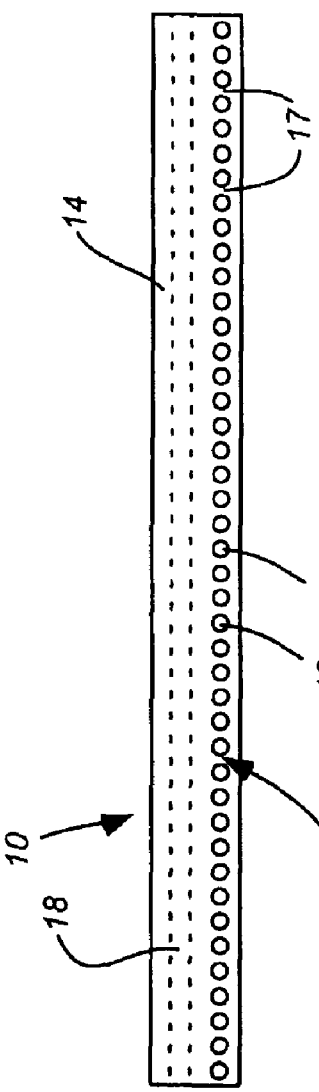

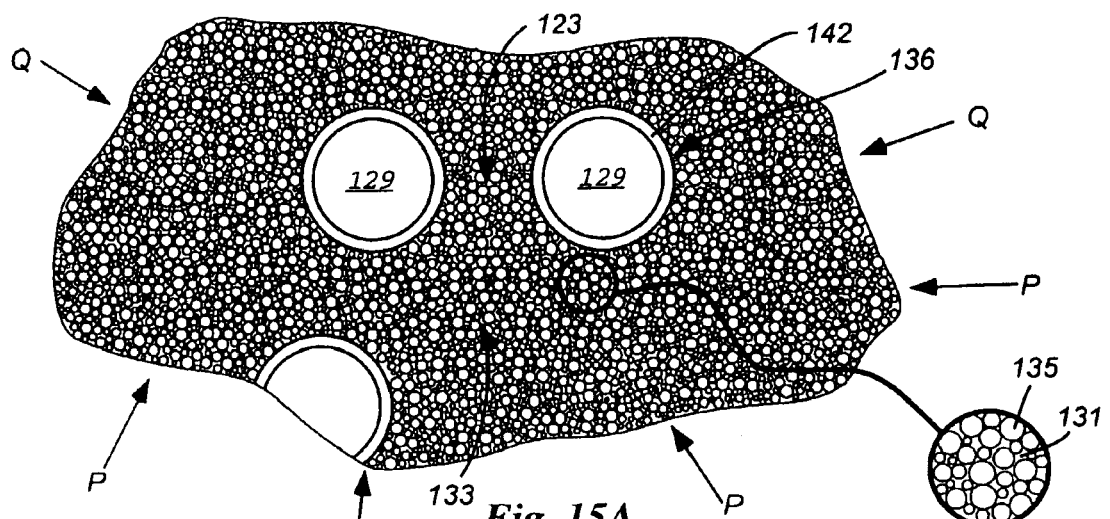
Fig. 15A
Fig. 15A*
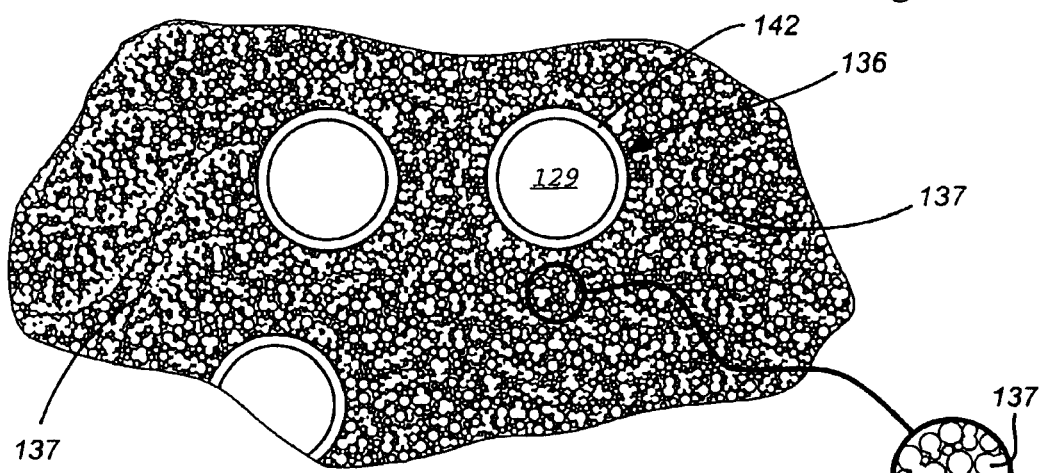
Fig. 15B
Fig. 15B*
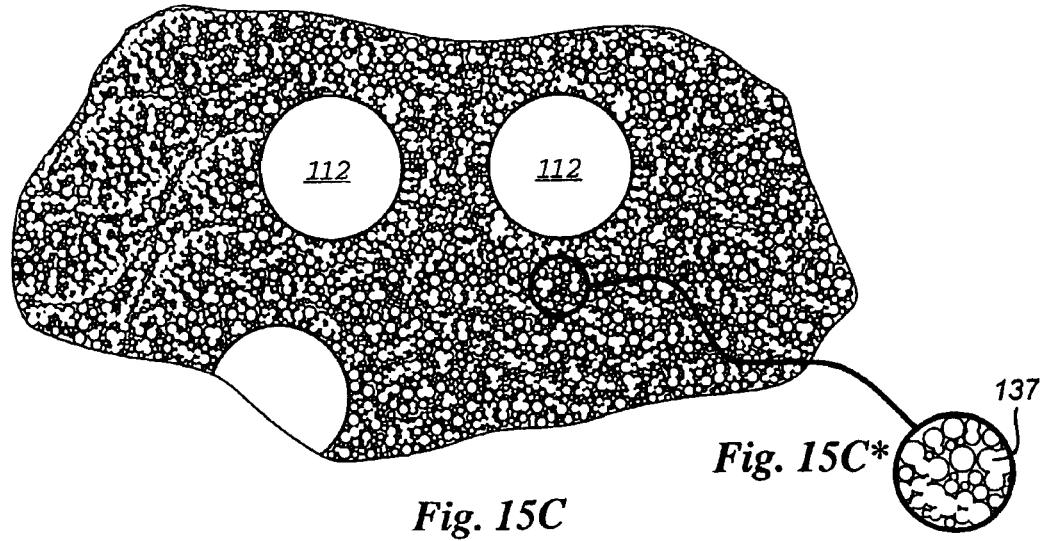
Fig. 15C
Fig. 15C*

METHODS FOR FORMING ARTICLES HAVING VERY SMALL CHANNELS THERETHROUGH, AND SUCH ARTICLES, AND METHODS OF USING SUCH ARTICLES

GOVERNMENT RIGHTS

The United States Government has certain rights in this invention pursuant to the Office of Naval Research contract/grant N00014-00-1-0170 (also with extension modification number P00003).

A partial summary is provided below, preceding the claims.

The inventions disclosed herein will be understood with regard to the following description, appended claims and accompanying drawings, where:

BRIEF DESCRIPTION OF THE DRAWINGS

FIG. 1A is a schematic elevation view showing the channeled article shown in FIG. 1, with some channels shown in phantom, from direction A—A;

FIG. 1B is a schematic end view showing the channeled article shown in FIG. 1, with some channels shown in phantom, from direction B—B;

FIG. 13D showing the channeled article after removal from the mold, and after the cores have been removed from the molded articles, forming channels therethrough;

FIGS. 15A–15C are schematic cross-sectional diagrams, showing an enlargement of a portion of a precursor of what will become a tubeless channeled article, showing a number of coated core members, and powder particles that will become sintered, at several steps during heat treatment, with: FIG. 15A showing the body before sintering; FIG. 15B showing the body with the powder particles sintered to each other; and FIG. 15C showing the body after the cores have been pulled out;

FIGS. 16A–16E are schematic cross-sectional diagrams, showing an enlargement of a portion of a precursor of what will become a tubeless channeled article, showing a number of coated core members, and powder particles that will become sintered, at several steps during heat treatment, using a liquid infiltration diffusion bonding form of sintering using coated particles, with: FIG. 16A showing the body before heating, with the powder particles packed around core members; FIG. 16B showing the body as a liquid infiltrant is heated and provided under pressure to the volume of powder particles; FIG. 16C showing the body with the liquid infiltrant filling the entire void space within the body, and with the coating on the particles diffusing in to the particles; FIG. 16D showing the infiltrant and particles having fully interdiffused, to create a solid, single phase; and FIG. 16E showing the article after it has cooled, solidified, and the cores have been removed;

DETAILED DESCRIPTION

There are many applications where it is beneficial to have a body, or an article, with very small channels therethrough. (By "very small," it is meant, generally, on the order of 0.000075 in. to 0.02 in. (0.00019 cm –0.051 cm) and even large as 0.125 in (0.318 cm) in diameter.) One such application is a heat sink for semiconductor devices. In general, as such devices become more powerful, they generate more heat, and heat sinks must become larger, unless a different technology for the heat sinks is used. Present technology (fanned forced air and finned heat sinks) can typically dissipate a power density of no more than about 30 watts/$cm^2$. Given the expected heat generation of such semiconductor devices, it would be beneficial to have higher power dissipation heat sink devices. Other applications for channeled articles are discussed in more detail below, including but not limited to: construction materials with tailored acoustic properties; high strength and low weight construction materials for aerospace applications; physical supports with micro-actuatable regions, and protective armor, just to name a few.

Inventions disclosed and described herein include methods of making articles with very small channels therethrough, the articles themselves, and methods of using such articles, and specialized apparatus incorporating such articles. For initial discussion purposes, it is helpful to keep in mind an application for a heat sink. However, the inventions described herein are not limited to such an application, and any other application in which such small channeled articles can be used, is contemplated as an intended use for such articles.

Figure 1:
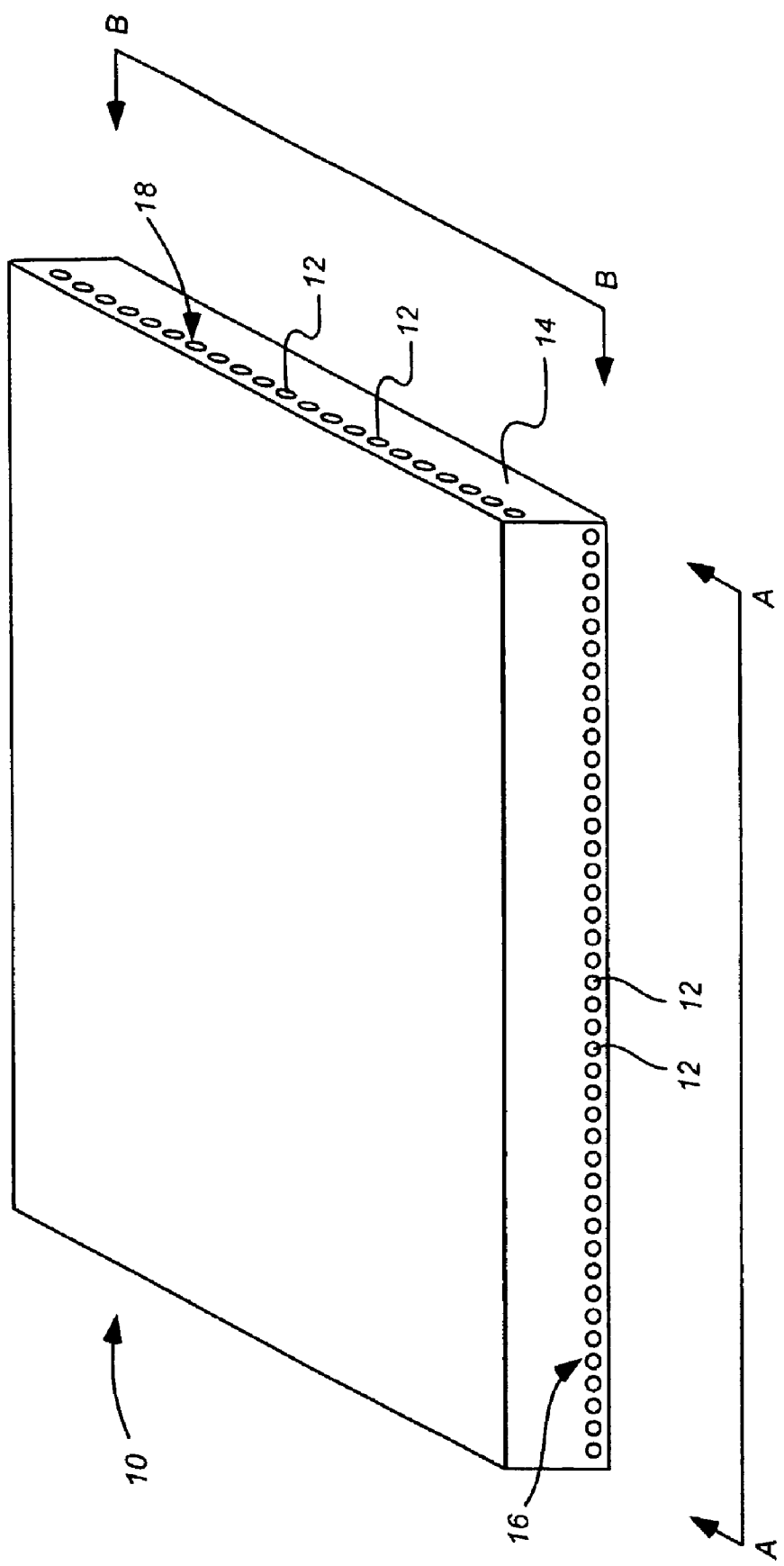
FIG. 1 is a schematic perspective rendition showing a channeled article.

FIG. 1 shows, schematically, in a perspective view, an article 10 having a plurality of channels 12 throughout the body 14 of the article. In the case shown in FIG. 1, the channels are arranged in two sets, with a first set 16 and a second set 18. These two sets are shown with additional features in FIGS. 1A and 1B. FIG. 1A shows the body from the front, left hand side of FIG. 1 and FIG. 1B shows the body from the right hand side. The channels 16 are all parallel to each other, and lie in a plane. The channels 18 are all parallel to each other, and perpendicular to the channels 16, and lie in a second plane. The first and second planes are parallel to each other, and spaced from each other, with the first plane being below the second plane, as shown in FIG. 1.

The channels 12 are open from end to end. The body 14 is typically substantially solid, and may be composed of a variety of materials, including metal, ceramic, or high-temperature resistant (refractory) polymer. In some cases, such an article can be highly porous, lightly sintered, such as for a gas diffuser or a catalyst.

Figure 4:
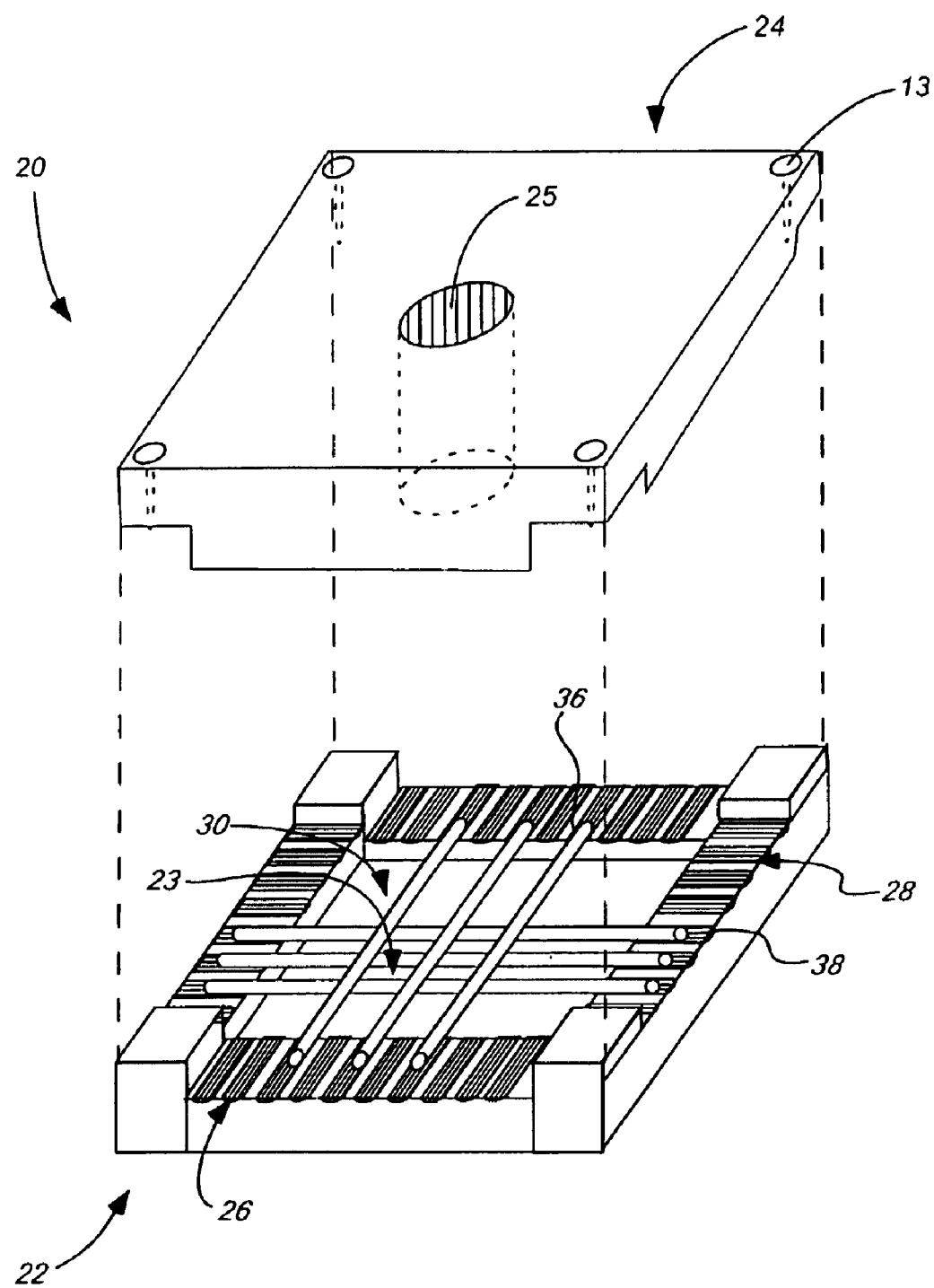
FIG. 4 is a schematic perspective view of an apparatus for clamping elongated core members, around which core members, matrix material will be provided and formed into a channeled article.

FIG. 4 shows, schematically, a fixture 20 for fabricating such a channeled article. The fixture 20 has a bed portion 22 and a cover portion 24. For the pattern of channels shown in FIG. 1, a fixture has a first set of grooves 26 and a perpendicular, second set of grooves 28. To fabricate the part, core members are laid in the fixture. A first set of core members 36 is placed in the grooves 26 and a second set is placed perpendicularly, in the second set of grooves 36. No core touches any other core, either in its own set, or in the other sets. The cover 24 is clamped by any suitable clamps 13, for instance bolts, to secure the core members 36 and 38 within the fixture.

Thus, the core members establish a network, made up of their bodies 36 and 38. The network lies within a cavity 30 that forms between the bed portion 22 and the cover portion 24. There are spaces 23 that are bounded by the core members and the fixture members 22 and 24. To fabricate the channeled article, the interior spaces 23 are filled with a matrix forming material. There are several different ways to provide the matrix forming material, which are discussed below.

Figure 5:
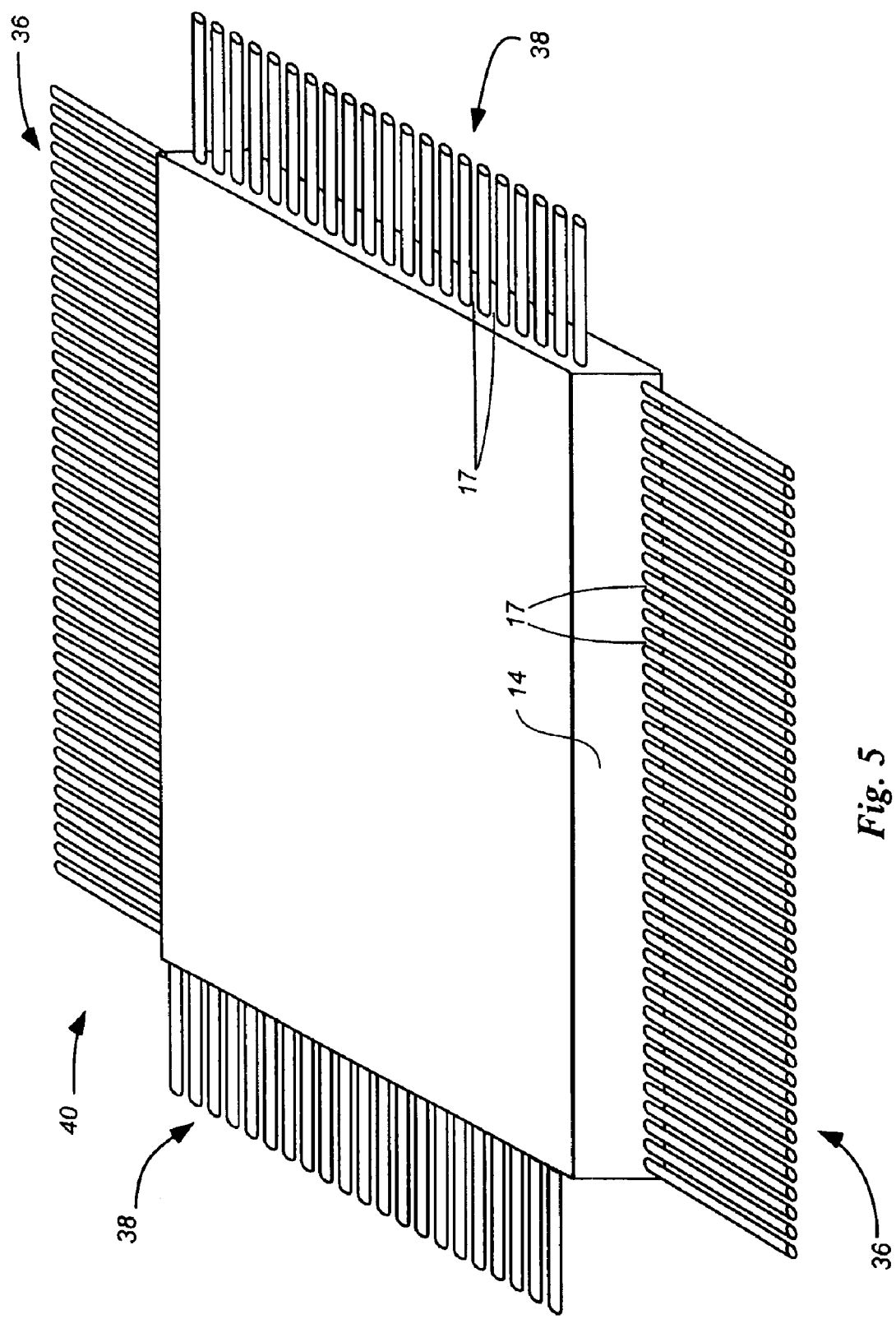
FIG. 5 is a schematic perspective rendition showing an intermediate part for a tubeless channeled article, with a body that has been removed from a fixture, with core members yet remaining in the body.

FIG. 5 shows, schematically, an intermediate part 40 after it has been removed from the fabricating fixture. The part has a body 14 of matrix material, which is composed of the material that was provided to the mold (or a material into which the provided material has transformed, under the conditions of the environment in which the fixture was held). The intermediate part also includes the first set of cores 36 and the second set of cores 38, both of which are now surrounded by matrix material, that makes up the body 14 of the intermediate article 40.

After the intermediate part 40 has been formed, the cores 36 and 38 are removed, by pulling them out, mechanically. They can be pulled out from either end. The resultant is a body 14 of matrix material, with the first and second sets of open channels 16 and 18 passing therethrough, as shown in FIG. 1. In some cases, the body is heat treated, or otherwise treated after the cores are removed. In other cases, it is not. Precipitation hardened materials, such as 6061 aluminum alloys, or steel are examples of heat treated materials.

Thus, the channeled article is fabricated by forming a body around cores that define the channels that will be formed, and then by removing the cores. Therefore, it is important to insure that the cores can be removed from the solidified matrix material. An important aspect of an invention disclosed herein is to use a core release coating to insure that each core will release. The core release can be applied before or after the cores are placed in the fixture. (There are some aspects of inventions disclosed herein, where a coating is not required. These are discussed below.)

There are generally two different types of channeled articles disclosed herein. One type, just described, has a generally uniform body, with open channels therethrough, in which the wall of the channel is the same material as the bulk of the body. These are formed, as described above, by pulling out cores from a formed unitary body. They are referred to herein generally as "tubeless" articles. The rationale for the name will be more evident after the second type is described.

With the second type, hollow tubes are placed in a fixture, and the body is formed around the hollow tubes. The hollow tubes remain in the article, and their hollow regions form the channels of the articles. The tubes form the walls of the channels, and thus, such articles are referred to herein as "tube-walled" articles. Tubeless articles are discussed first.

Coating Considerations for Core Removal

There are at least three basic families of methods of fabricating a tubeless channeled article: a liquid state method (FIGS. 2A–2D); a solid state method (FIGS. 15A–15C); and a hybrid solid/liquid state method (FIGS. 16A–16E). These families are discussed, generally, below. There are common features to each of these methods, and, thus, common features to beneficial properties of the core release coating. In each, molding material is provided, and is transformed into a unitary body that surrounds the core members. It may be solidified molten mold material, or sintered particles.

Figure 2:
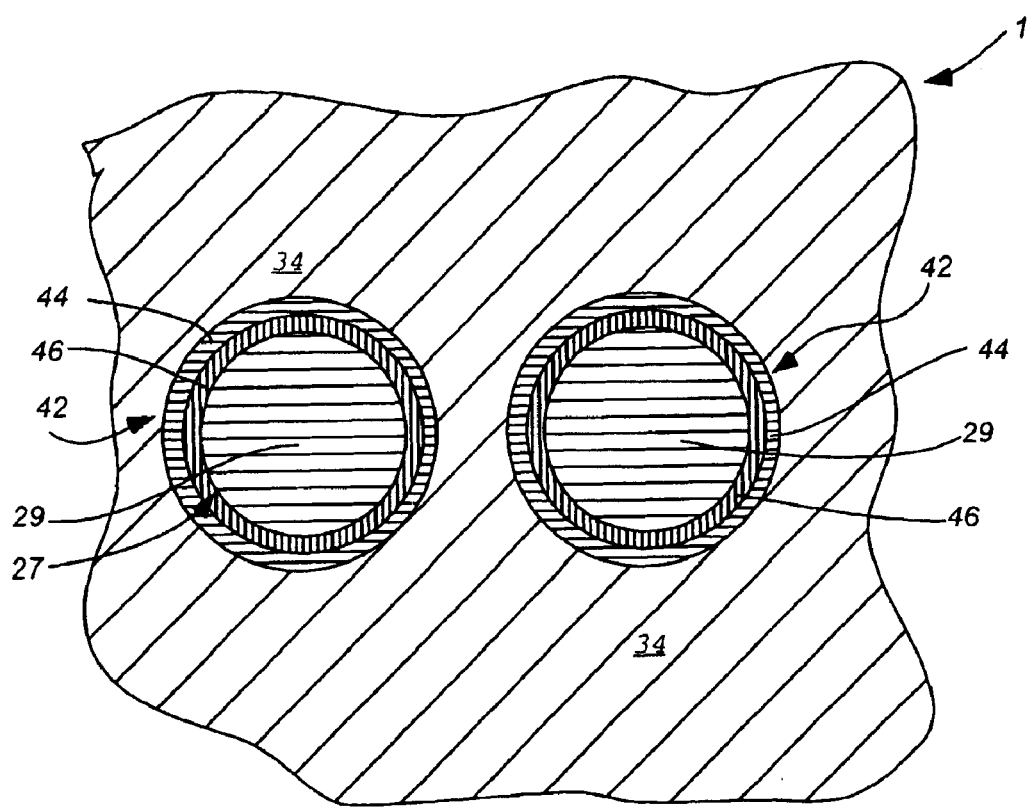
FIG. 2 is a schematic cross-sectional representation of a coated, elongated core members surrounded by matrix material, before removal of the core members.

Given that the core release coating must insure that the core will release, there are several characteristics that the coating should preferably have. As is discussed below, and as is illustrated schematically in FIG. 2, the body 14 of the tubeless channeled article 10 is typically formed by a method that presents a metal 34 adjacent the core members 42, either in a molten state, or a significantly heated state where sintering occurs. The result is that the molten or sintered material 34 subsequently solidifies. FIG. 2 shows a two layer core release coating 29. In many cases, the coating is only single layer. In others, it may be two or more layers. (In some cases, discussed below, no coating layer is required.) The figure shows two layers, so that it can be used to illustrate both single and multi-layer cases. (FIG. 2 is idealized and will be used to illustrate aspects of all three families of methods (liquid, solid, and hybrid states)). Thus, doing such triple duty, for some of the following discussion, the reader must consider the matrix material 34 to have been, at one time, molten, and then solidified. For other parts of the discussion, it is sintered, either solid state or hybrid state. (It is also possible to use ceramics or high temperature polymers for the body material, if that is a suitable material for the application.)

One requirement of the coating 42 is that in a liquid state, or hybrid liquid/solid state method, it prevent molten metal 34 from wetting the core material 29. Wetting will be prevented if there is at least one interface between materials that is not wetted. This is in part, because wetting is a form of bonding. Thus, if the core is wetted, that will render it more difficult to pull it out after the body is formed. For instance, there should be a non-wetting relationship between at least one of the following pairs: the matrix forming material 34 and the outer coating layer 44; the outer coating layer 44 and the inner coating layer 46; or the inner coating layer 46 and the outer surface 27 of the core 29. That is, the contact angle between the two non-wetting materials must be greater than 30 degrees. Or stated alternatively, the surface energy of one surface must be low enough to prevent wetting.

It is not necessary that there be no wetting at each interface. For instance, it is convenient if the matrix material 34 wets the outer layer 44, thereby closely conforming to its shape, while there be no wetting, either between the outer layer 44 and the inner layer 46, or between the inner layer 46 and the core material 29, thereby permitting removal of the core member, with separation between the non-wetted layers.

Another requirement is that the coating 42 also serve as a barrier to protect the core member 29 from erosion by any molten body filler metal 34. This is very important, because contact of one metal by a molten metal potentially presents a special problem. If the two metals are miscible; the molten hot material 34 can erode the solid core members 29 within a fraction of a second. In a related role, the coating must also prevent the core member from dissolving in the molten body filler material 34.

In solid state and hybrid solid/liquid state metals, the coating 42 must also prevent any corrosion from occurring between the core material, and hot solid particles that are to be sintered.

Still another requirement of the coating 42 is that it must be smooth enough so that it does not cause mechanical interlocking between the core material 29 and the hot material 34. It is also beneficial if the coating actually acts as a lubricant, between the core material and the molten material.

Thus, the coating 42 must prevent wetting of either the core material, or itself, by any molten filler material 34, and prevent the hot filler material 34 from corroding the core material, and from eroding or dissolving the core member material 29, if the matrix forming material is liquid.

FIG. 2 shows such a coating. A core member 29 is shown surrounded by matrix forming material 34. The matrix forming material is molten at the time of the process illustrated. The core member 29 is coated with a coating 42. As shown in FIG. 2, the coating itself has an outer layer 44, adjacent the matrix material 34, and an inner layer 46 (also referred to sometime herein as an "interlayer"), that is adjacent and covers the core member 29 itself. However, the present example is for a single coating. As an example, the core member 29 may be Ni, Cu, Fe, or Al; the hot material 34 may be Fe-x eutectic; and the core release coating 42 may be of a ceramic.

In general, possible coatings include high temperature polymers (such as polytetrafluoroethylenes (PTFEs)), chemical or vapor deposited metal interlayers, ceramic oxides, ceramic silicides, and ceramic nitrides. Boron nitride is a suitable candidate for many types of combinations of core metals and matrix materials. Ceramics, in general, in many cases perform the functions of preventing erosion, dissolution and corrosion, as well as preventing bonding between the core material and the matrix forming material. Thus, a single ceramic coating layer can often be used, rather than a dual layer. The coating should be non-wetting with the matrix forming material and thermally stabile at the liquid or solid temperature of processing.

As mentioned, FIG. 2 shows a coating 42 having two layers: an outer layer 44 and an inner layer 46. Such two layer arrangement may be beneficial, for instance, if there is a large difference in coefficient of thermal expansion of the core 29 material and the matrix material 34. In that case, the inner layer 46 could include a lubricant while the outer layer 44 prevents wetting, as discussed above. Another potential for using two coating layers, is, as discussed above, where the outer layer is wetted, thus promoting conformation of the shape of the matrix material around the core, while the inner layer results in a non-wetting interface, either between it and the outer layer, or, between it and the core material. One or both of the coating layers must also provide the protection against erosion, dissolving and corrosion.

Figure 3:
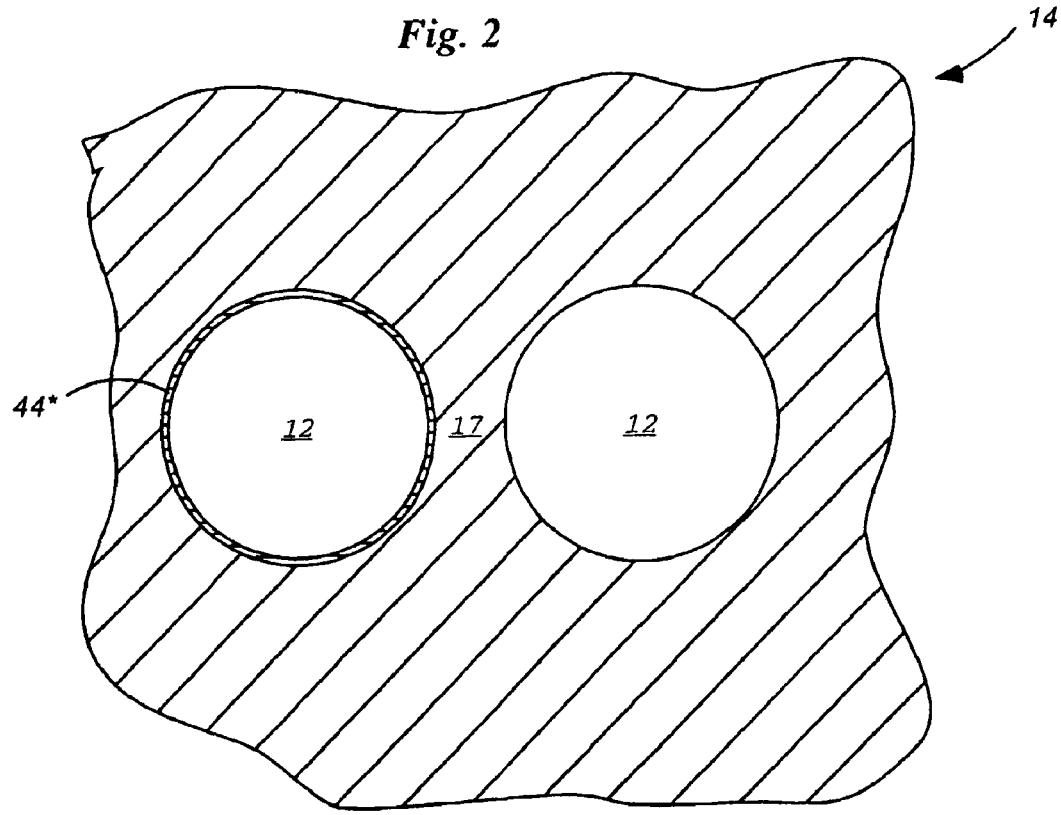
FIG. 3 is a schematic cross-sectional representation of the matrix material shown in FIG. 2, after the core members have been pulled out.

FIG. 3 shows a portion of a channeled article 10 after the core members 29 have been removed, to leave open channels 12. The hot material has solidified into the body portion 14, including the regions 17 between the open channels 12. As shown on the right hand side of FIG. 3, the coating of core release material has been completely removed, having adhered to the core member 29. In some cases, as shown on the left-hand side of FIG. 3, a very thin residual layer 44* of the outer coating layer may remain.

Anodized core members are also possible. For instance, an anodized aluminum surface coating of aluminum oxide $Al_2O_3$, is ceramic, and won't bond to most matrix materials (unless it is broken down). Anodized titanium has a ceramic titanium oxide surface layer. Thus, an anodized Aluminum or titanium wire core member would work without any additional coating, with many different matrix materials. In a sense, the coating is integral with anodized core members.

Cases where No Coating is Required for Tubeless Structure

In some cases, no coating is required. As is discussed above, the coating is used to prevent corrosion, dissolving and erosion, and bonding. Typically, if the matrix forming material wets the core material, then bonding is a potential problem. Similarly, if the materials are miscible, then erosion is a potential problem. However, if the matrix forming material and the core material can satisfy the other use and processing needs of the article, and bonding, erosion and corrosion are not problems, then no coating is necessary. This would typically only be the case if the matrix forming material does not wet the base core material, and if they are not miscible.

For instance, using ceramic fibers, such as carbon, for the core members, with metal matrix forming material, would not require any core release coating, as the undesirable conditions of miscibility and wetting are not present. There are also metal core and metal matrix material combinations that are not miscible, and not wetting. Such coating free articles, and methods of making and using them are contemplated as inventions herein.

Methods of Forming Body Portion

Any suitable method for forming the body portion of the article is considered to be part of the inventions disclosed herein. Several suitable techniques are discussed here. They include, but are not limited to: liquid state (FIGS. 12A–12D); solid state, typically conventional sintering (FIGS. 15A–15C); and a hybrid liquid solid variation of diffusion bonding, referred to herein as "liquid infiltration diffusion bonding."

Liquid State

There are several liquid state methods, including: die casting, pressurized infiltration, vacuum assisted infiltration, liquid phase sintering, and extrusion. Die casting will be discussed as generally representative of these liquid state techniques, illustrated with references to FIGS. 4 and 12. Molten matrix forming material 34 is introduced into the cavity 30 of the closed fixture 20. It flows into the spaces 23 between the core members 36 and the fixture components. Subsequently, the fixture is maintained under heat, pressure and atmosphere conditions such that the molten molding material 34 solidifies. After it solidifies, the core members 36 can be pulled out. The process of filling the spaces 23 between the network of core members 36 is referred to herein as "core infiltration" or, more typically, "body filling."

Some of the discussion in the next section also contemplates a sintered body to form the matrix around the cores. Infiltration of porous sintered bodies to form a fully dense body is a known process. The sintered bodies of the methods discussed below may, or may not be infiltrated after sintering, or, during sintering, in the case of the hybrid liquid/solid state technique. Any such infiltration is different from the core infiltration referred to in this section. (Typically, if the matrix body is formed by core infiltration, there will not be a sintering step, and thus, there will not be infiltration of a sintered body.)

It is important, during any body filling, to minimize the presence of any uncontrolled voids around the cores. Such voids would act as stress and heat concentrators, which would most likely be undesirable for most applications of the channeled article. However, because at least one layer of the core release coating is typically non-wettable by the molten material, there will naturally be a resistance to close contact between the core members and the molten matrix material. Thus, a pressure source 32 (FIG. 13A) must be used to force the molten material around the core members 36, and throughout the cavity 30 of the mold, filling all of the spaces 23, between core members. The core members 36 may be in a single layer or multiple layers, as shown.

Figure 13A:
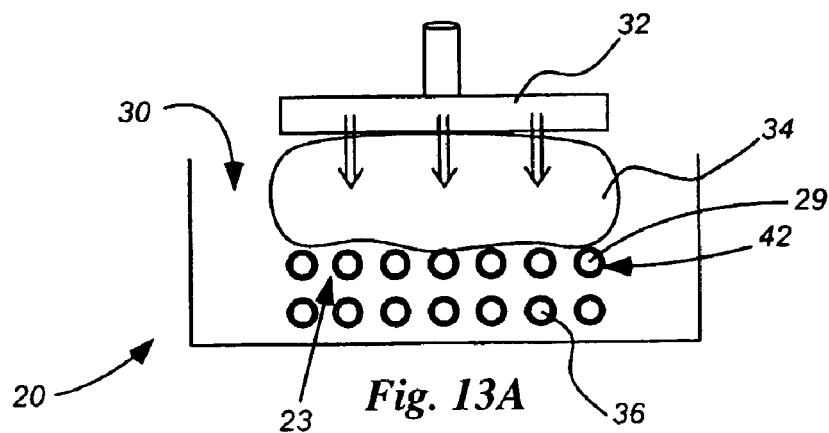
FIGS. 13A, 13B, 13C, and 13D show schematically a liquid state process for forming a tubeless channeled article, with FIG. 13A showing a mold containing a plurality of cores, and a mass of molten molding material being pressed around a first rank of cores; with FIG. 13B showing the mass having advanced further around the cores; with FIG. 13C showing the molten liquid being pressed around a second rank of cores.
Figure 13B:
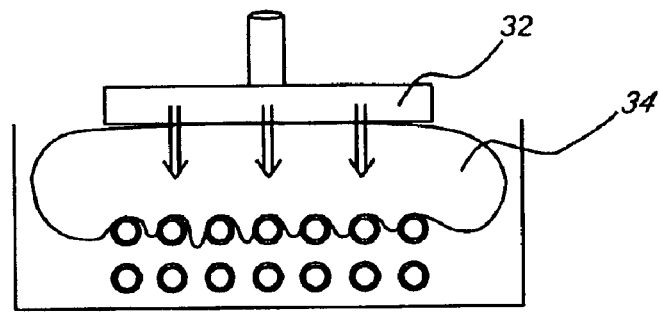
Figure 13C:
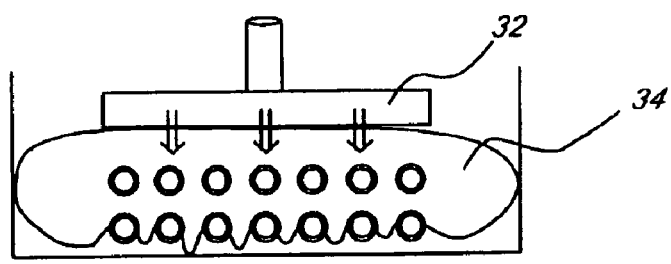
Figure 13D:
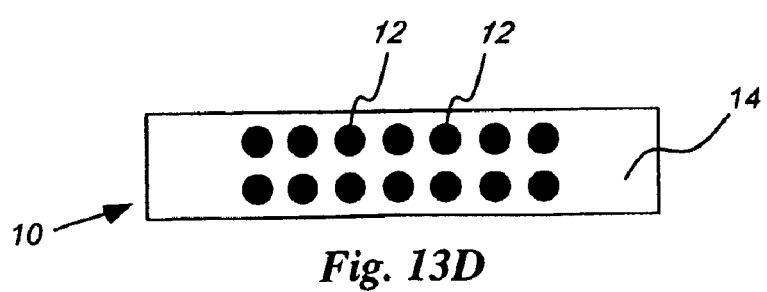

FIG. 13A shows a stage in the process where the material is pressed into a mold cavity 30, and onto a network of coated core members 36. The core members constitute a solid core 29, and a core release coating 42. FIG. 13B shows a stage where the molten material is pressed around the first layer of core members, between individual members. FIG. 13C shows a stage where molten material is pressed between two layers of core members, and between members of a second layer. FIG. 13D shows a state where a channeled article 10 has been removed from the mold, and the core members have been removed from the solidified body material 14 (formed from molten material 34) to form channels 12, which extend entirely through the body 10.

It is also important to consider the delicacy of the core members 36 when using pressure to inject the molding material and remove voids.

As an example, 1.75 in. (4.45 cm) long stainless steel (SS304) wire core members having a diameter of 0.012 in. (0.03 cm) were coated with boron nitride in a layer of 0.001 in. (0.0025 cm) and retained in a fixture. The core members were spaced apart 0.011 in. (0.028 cm) between cores, on 0.022 in. centers (0.056 cm). Molten tin was introduced into the cavity of the fixture, and was pressurized to fill all of the spaces. It was cooled to room temperature. The body contacted the core members along 1 in. (2.54 cm) of their length. The core members were removed by pulling with hand force.

The tin in the preceding example was introduced into the fixture using pressure core infiltration with a screw mechanism. The fixture shown in FIG. 4 has a port 25 in the cover 24, or another suitable delivery channel for molding material. This apparatus was used in a laboratory setting. Such a technique is functionally similar to conventional die casting, which would be suitable for production scale implementations of this method.

According to another example, steel cores can be coated with a carbon core release layer, and molten aluminum can be used to form the matrix. In another combination example, molybdenum core members can be coated with boron nitride, and steel can be provided as the molten matrix material.

Vacuum Assisted Infiltration

Rather than positive pressure being applied to the molten material, negative pressure can be applied to the cavity 30, and the related technique of vacuum assisted core infiltration can be used. For negative pressure, it is necessary to provide a port or other mechanism for introduction of the molding material, as well as a conduit (not shown) for application of vacuum pressure. Vacuum assisted infiltration is discussed in detail in U.S. Pat. No. 5,553,658, entitled METHOD AND APPARATUS FOR CASTING, issued on Sep. 10, 1996 to James A. Cornie, which is incorporated herein fully by reference.

Solid State Techniques

The body portion can also be formed by various solid state techniques, typically sintering, as shown schematically with reference to FIGS. 15A–15C. As shown in FIG. 15A, a powder material 133 is packed within a fixture, similar to that shown in FIG. 4, with the powder 133 fully surrounding the core members 136 and filling all of the spaces 123 therebetween. The powder particles 135 (see enlarged portion 15A*) can be metal, or refractory ceramic, and are packed, necessarily with voids 131 therebetween. The core members 136 are a solid core member 129 with a core release coating 142. Heat Q and pressure P are applied to the fixture, under conditions such that the individual powder particles 135 sinter together conventionally as shown schematically in FIGS. 15B and 15B*. The result is an interconnected unitary body 137 made up of formerly separate particles 135, now a sintered mass. Care must be taken that the pressure applied not be so great as to deform the core members 129 to a degree that they cannot be pulled out, or to interlock them with the particles. Either could make it impossible to remove the cores from the body.

FIG. 15A shows a fixture in a schematic cross-sectional view, showing the coated core members 129 surrounded by particles 135, before any heat treatment is applied. FIG. 15B shows the same components after heat has been applied, and the particles 135 have sintered (diffused) together. Note that the core release coating 142 remains intact. FIG. 15C shows the situation after the entire set-up has cooled and after the cores 129 have been pulled, leaving channels 112 in a channeled article. The core release coating has prevented the hot powder particle material 135 from corroding the core material 129. Corrosion can take place at temperatures lower than that at which the powder 135 becomes molten.

Hybrid Solid/Liquid State

Liquid Infiltration Diffusion Bonding ("LIDB") is a variation of diffusion bonding that has been relatively recently developed and constitutes a hybrid liquid/solid state technique. See, Wei Dong Zhuang, "Applications of Powder Interlayers for Large Gap Joining" (Ph.D. Dissertation submitted to Massachusetts Institute of Technology, Department of Materials Science and Engineering, 1996) for a general discussion, which is incorporated fully herein by reference.

Figure 16A:
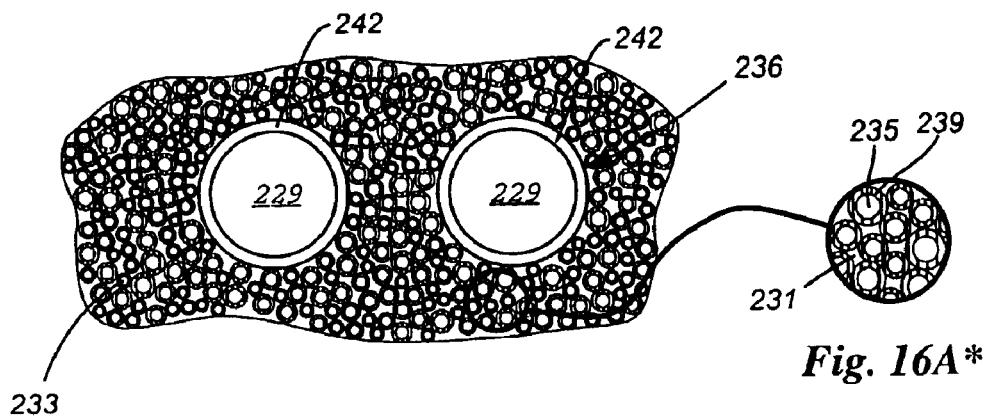

As shown in FIG. 16A, particularly enlargement 16A*, the sintering powder 233 is made up of particles of a base material 235, which is coated with a coating 239. The base material 235 is typically a metal alloy, such as a copper alloy. The particles 233 touch each other, with open pore spaces 231 therebetween. The cores 236 are surrounded by the particles 233.

Figure 16B:
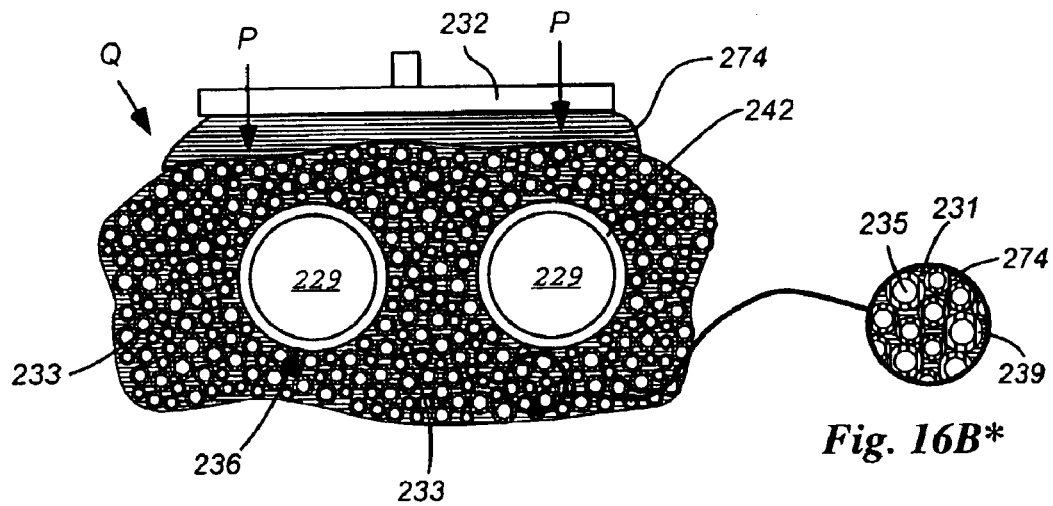

As shown in FIG. 16B, a molten filler material 274 is provided by means of a pressure source 232. The pressurized liquid filler material 274 is forced throughout the body of particles 233, filling up all of the pore spaces 231. The filler material is also a metal, such as silver. The coating 239 prevents the molten filler material 274 from contacting the base material 235 of the coated powder particles 233. If there were to be contact too soon, it could happen that the two materials would inter-diffuse to form a phase that is solid at the desired infiltration temperature, thereby resulting in solidification and choking off of the flow, by dissolving copper into small particles that fill the interstices between particles. For instance, for silver filler material 274 and copper base material 235, a suitable coating material 239, is nickel. The nickel coating prevents this, allowing full penetration of the molten material 274. Typically, the amount of molten material provided is sufficient only to fill the volume of pore spaces 231, and little more.

Figure 16C:
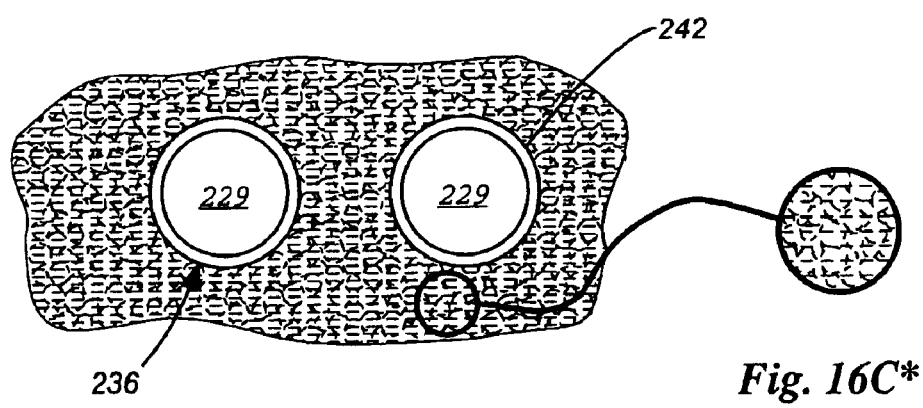

FIG. 16C shows the situation a bit later, after the nickel coating 239 has diffused into the copper. It no longer acts as a diffusion barrier between the base material 235 and the filler material 274. The copper of the base material 235 and the silver of the molten infiltrant 274 interdiffuse (along with the nickel of the coating material 239), to result in a unitary single phase body, composed mostly of the metal of the base powder material 235, a small amount of the infiltrating metal 274, and very small amount of the coating material 239.

All of these materials are prevented from contacting and reacting with the core material 229 of the cores 236, by the core release coating 242. Thus, even if any of them are of a material that would erode, dissolve or corrode, or otherwise react with the core material 229, they can not do so. For the foregoing Ni coated Cu powder infiltrated with Ag, a suitable core material is stainless steel coated with boron nitride.

Figure 16D:
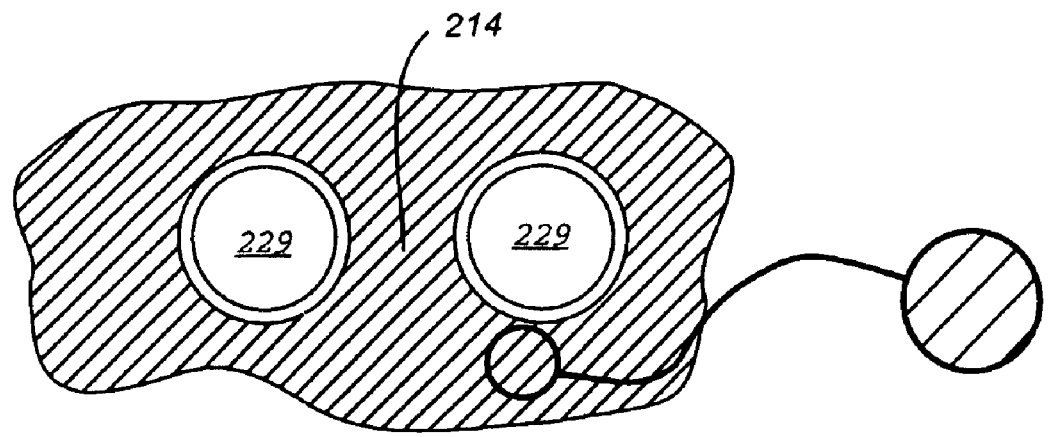
Figure 16E:
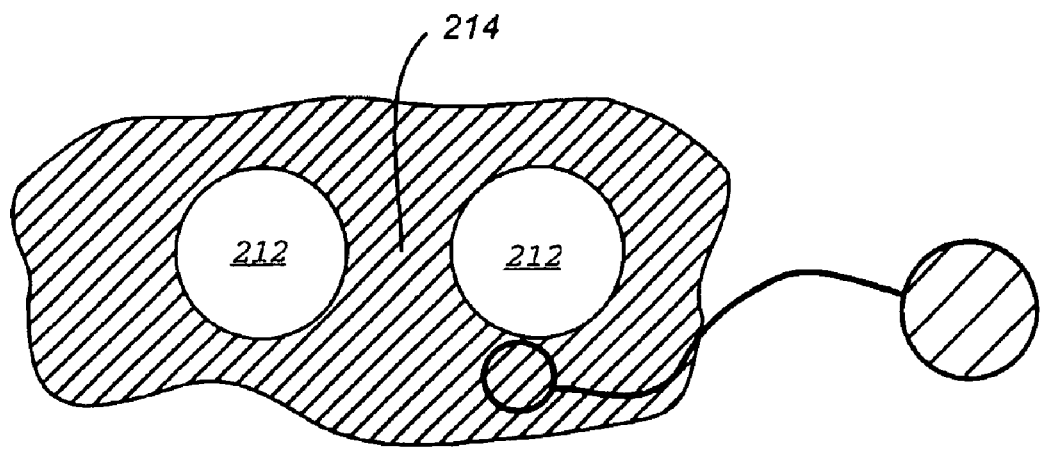

FIG. 16D shows the situation where the molten filler material 274 and the base particles material 235 and the particle coating 239 has all interdiffused to be a single phase material 214. FIG. 16E shows the situation where the cores 236 have been pulled out, forming channels 212 through the single phase material 214.

Method Steps of Forming Channeled Articles

Figure 14:
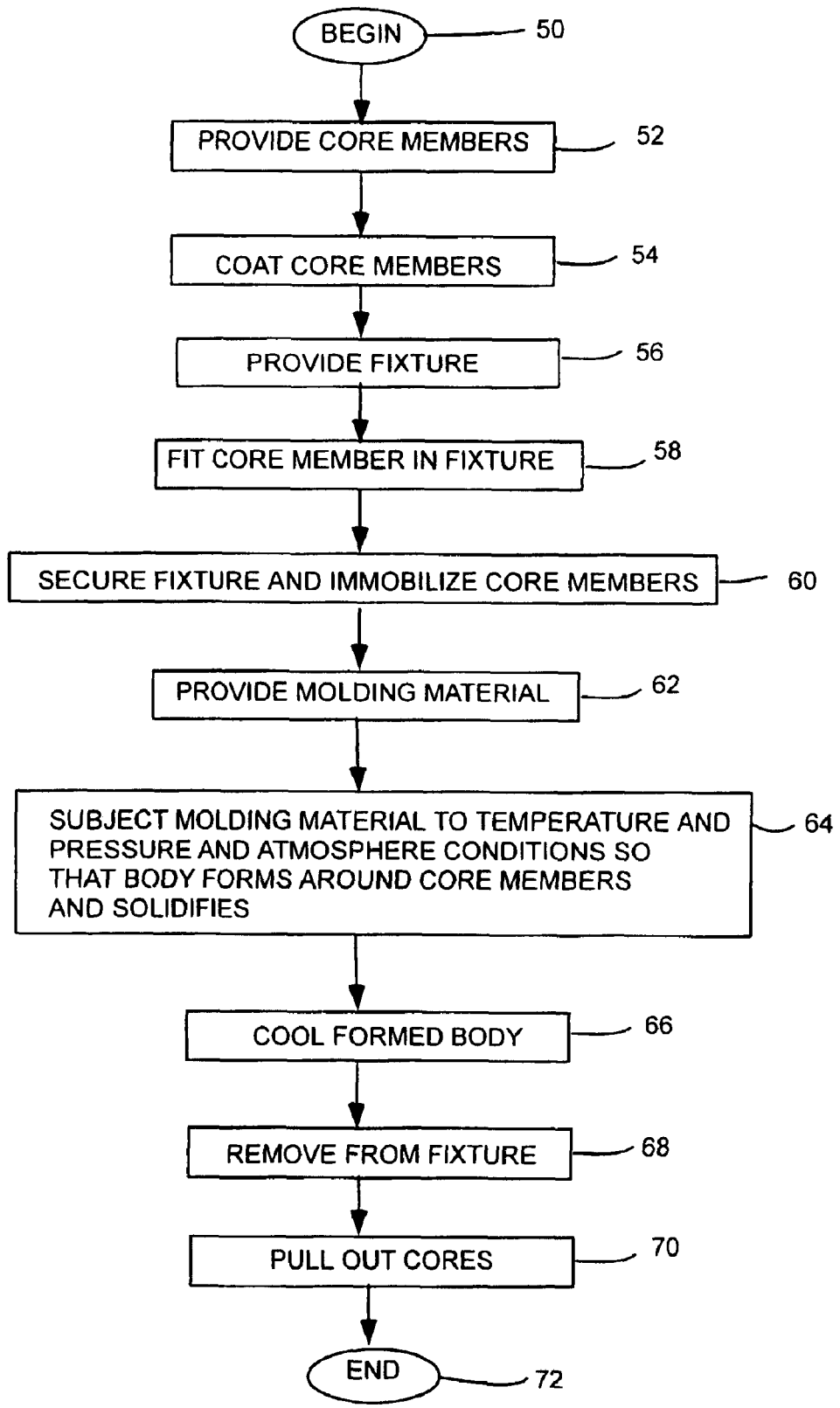
FIG. 14 is a schematic diagram in flow chart form, showing the steps of a method of producing a channeled article.

FIG. 14 shows, schematically, in flow chart form, a method of forming a channeled article, as described above. The process begins 50. Core members are provided 52. The core members are typically coated 54 with a core release coating before they are introduced into a fixture, although, as noted above, there are some special cases where a coating is not required. A fixture is provided 56 and the core members are fit 58 within the fixture. The fixture is secured 60 such that the core members are immobilized. The molding material is provided 62. For instance, it can be molten or powdered. If molten, it is forced under pressure around the core members. If powder, it is packed around the core members. The molding material is subject 64 to temperature and pressure and atmosphere conditions such that it forms around the core members and solidifies. After it has cooled 66, the body is removed 68 from the fixture, the core members are pulled out 70, and the process ends 72 with an article having channels therethrough.

Requirements for Core Members

There are several requirements for a suitable core member. The size depends on the application. For some applications, the channels can be very small in diameter. The channels will be essentially the same size as the coated core material. The core material would typically be wire, made according to any wire making technology. As is mentioned above, the diameter of the wire must be of a size that has a tensile strength that can withstand the stresses of pulling the wire out from the formed article body. The tensile stresses upon pullout are larger for a longer embedded length of the core. This is because frictional and other adhesion forces increase proportionally with increasing surface area, equal to length×2πR (were R is the radius of the wire). Tensile strength is proportional to $F/\pi R^2$. Thus, because strength shrinks with $R^2$ while frictional force shrinks with 2R, small wires will generally be at risk of breaking at lower frictional forces than thicker wires. However, due to processing issues and fracture mechanics, down to a diameter of about 0.002 in. (0.005 cm) smaller diameter wires are stronger (in force per unit area) than larger ones. Thus, they will be only marginally more susceptible to breakage.

The cross-sectional shape of the channel opening will be substantially identical to that of the core material. It can be any extrudable shape, including but not limited to: circular, rectangular, oval, polygonal, with all obtuse angles (such as a pentagon) or with acute and obtuse angles (such as a five pointed star). The cross-sectional shape is selected depending on various requirements of fabrication and use, such as, for a heat sink, the desired amount of heat transfer.

Different cross-sections will also have different effects on the degree of force required to pull them out, with those having relatively more surface area per unit length typically requiring more force than those with less. For instance, the example outlined above, with coated SS304 core members in a body of tin, approximately 20 lbs of force (110N) is sufficient to pull each core member out. In general, any cross-sectional shape that is theoretically extrudable is suitable for being pulled out from the matrix formed around the core members. The core member must be smooth in the axial direction (its direction of elongation). There should not be any elements that would mechanically interlock with the surrounding formed matrix material which would prevent pulling the core members out axially.

Typically, satisfaction of the foregoing requirements will result in an aspect ratio of the length/diameter or (in the case of more complex cross-sections) length/perimeter, which is very large as compared to what can be accomplished with other technologies, such as drilling or mechanical machining. For instance, aspect ratios of length/diameter of 100 to 1 are not unusual and up to 1000 to 1 and even 2000 to 1 are possible, if very strong tensile strength materials, such as tungsten or carbon fibers, are used for the cores.

If carbon fibers are used, some consideration must be taken of their smoothness. This is because, while very strong, carbon fibers are typically not very smooth. Thus, there may be interlock resistance with the formed matrix, unless particular care is taken to attend to the smoothness of the fibers.

Thus, taking into account the foregoing, in trying to achieve channels of larger aspect ratios, the designer is faced with limits imposed on the maximum length of the channel, because as the length increases, so does the force required to pull it out. Conversely, the designer is also faced with limits imposed on the minimum cross-sectional size of the core, because, in general, smaller diameter wires will break under lower tension than larger ones. Just when these limits will be reached depends on the particular core material used, and the core release material, which affects the force that resists pulling out. For some of the applications discussed below, the largest possible fabricatable aspect ratio will not provide optimal performance, in which case, other, operational factors will limit the largest usable aspect ratio. For instance, very large aspect ratios may result in channels that become clogged, or provide poor heat transfer.

It is also necessary for the core material to satisfy several compositional requirements. The lowest melting temperature of the core material must be higher than the temperatures required to process the body matrix material. In some cases, the lowest softening temperature of the core material must also be above the processing temperature. The core material must be corrosion resistant in the presence of the body matrix material. Further, the core material must not dissolve in the presence of the body matrix material. In addition, there must be available a suitable coating material to prevent adhesion and bonding between the core material and the body matrix material. In some cases, erosion or corrosion of the core material by the matrix material may also be prevented by a coating.

Hollow Core Members

Figure 17:
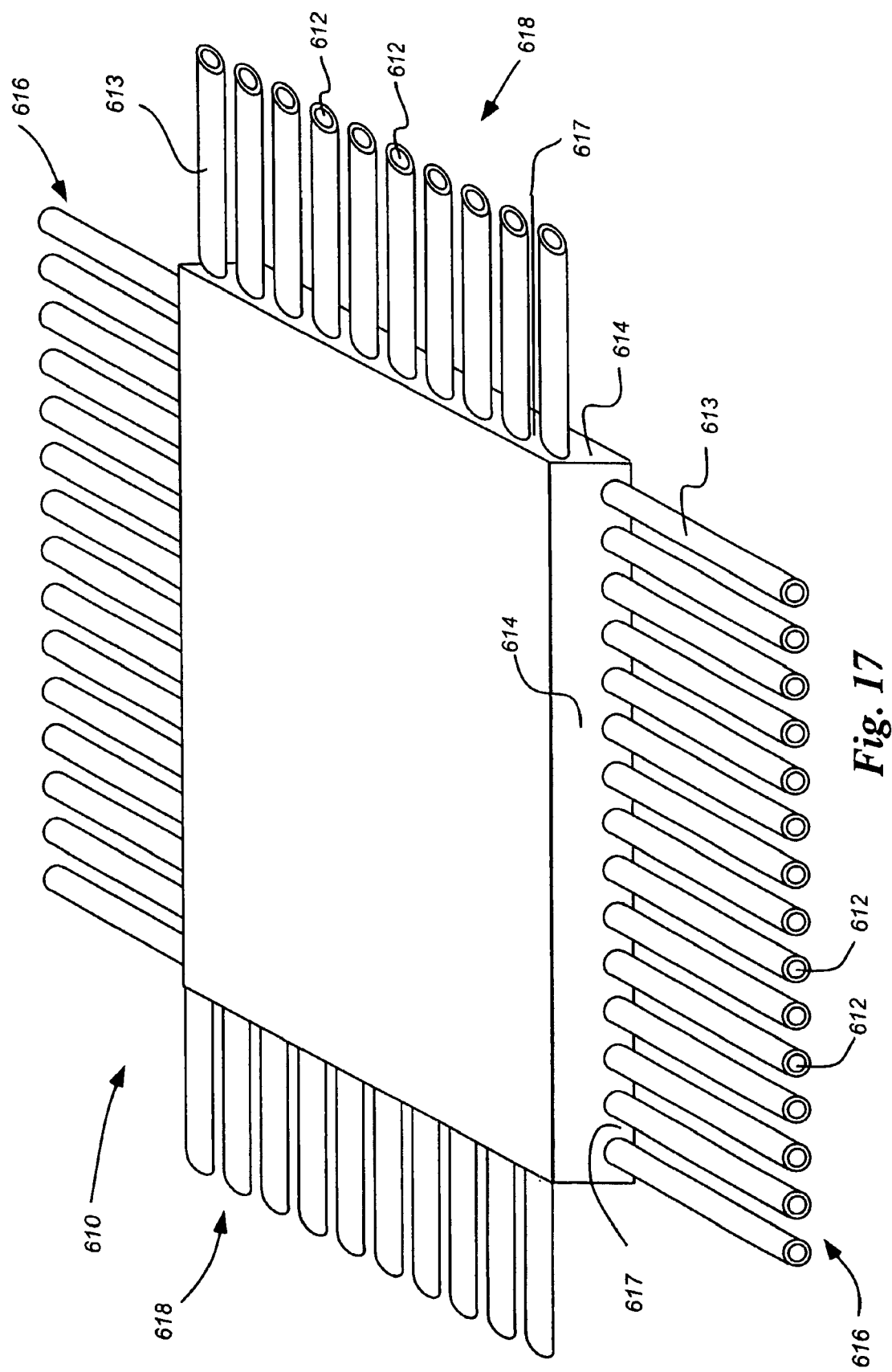
FIG. 17 is a schematic perspective rendition showing a tube-walled channeled article having hollow tubes extending through and beyond the body of the article.

The foregoing discussion has generally been framed discussing solid core members. This need not be the case. The core members can be hollow, either thin-walled or not-so-thin walled tubes. Such hollow tube cores can be removed in the same manner as can be solid tube cores. Tubeless articles made with such hollow, removable cores are different from, and should not be confused with tube-walled channeled article, discussed below, where an object is formed around hollow cores, which cores remain in the finished article. FIG. 17 shows, schematically, an article 610 with hollow core members 613. FIG. 17 is primarily used herein with reference to a discussion below of a product where the tubes remain in the finished product. However, it is also illustrative of an intermediate body, exactly analogous to that shown in FIG. 5, except that the core members 613 to be removed, are hollow, rather than solid.

Candidate Materials for Core Members

Providing that they can be drawn or otherwise formed into an extended shape, such as a wire, suitable core materials include, but are not limited to:

TABLE 1

| |
| --- |
| Hot or cold drawn steel |
| Stainless steel |
| High carbon steel |
| Low carbon steel |
| Ni—Cr—Fe type alloys, such as sold by Inco Alloys International, under the tradename "Inconel" |
| Ni—Cu type alloys, such as sold by Inco Alloys International, under the tradename "Monel" |
| Nickel or nickel alloy |
| Tungsten or tungsten alloy |
| Molybdenum or molybdenum alloy |
| Copper or copper alloy |
| Aluminum or aluminum alloy |
| Fe—Ni, type alloys, such as sold by Carpenter Technology Corporation, under the tradename "Invar" |
| Fe—Ni—Co type alloys, such as sold by Carpenter Technology Corporation, under the tradename "Kovar" |
| Iron alloys |
| Magnesium or magnesium alloy |
| Titanium or titanium alloys |
| Silver or silver alloys |
| Gold or gold alloys |
| Platinum or platinum alloys |
| Palladium or palladium alloys |
| Rhenium or rhenium alloys |
| Zinc or zinc alloys |
| Brass alloys |
| Vanadium or vanadium alloys |
| Chromium alloys |
| Cobalt or cobalt alloys |

In addition to metal core members, channeled articles may be fabricated with high temperature resistant (refractory) ceramic or polymer fibers, including but not limited to: Carbon fibers; glass; aramid fibers, such as are sold by DuPont under the trade name "Kevlar"; boron fibers, etc.

Candidate Materials for Body Matrix

Many metals may be used as the body matrix material, depending on the type of processing that is chosen. Each will impart unique properties and may be useful in many diverse, specific applications. Potential matrix metals include, but are not limited to:

TABLE 2

Stainless steel
High carbon steel
Low carbon steel
Ni—Cr—Fe type alloys, such as sold by Inco Alloys International, under the tradename "Inconel"
Ni—Cu type alloys, such as sold by Inco Alloys International, under the tradename "Monel"
Nickel or nickel alloy
Tungsten or tungsten alloy
Molybdenum or molybdenum alloy
Copper or copper alloy
Aluminum or aluminum alloy
Fe—Ni type alloys, such as sold by Carpenter Technology Corporation, under the tradename "Invar"
Fe—Ni—Co type alloys, such as sold by Carpenter Technology Corporation, under the tradename "Kovar"
Iron alloys
Magnesium or magnesium alloy
Titanium or titanium alloys
Silver or silver alloys
Gold or gold alloys
Platinum or platinum alloys
Palladium or palladium alloys
Rhenium or rhenium alloys
Zinc or zinc alloys
Brass alloys
Vanadium or vanadium alloys
Chromium alloys
Cobalt or cobalt alloys In addition to metals, thermoset and thermoplastic polymers and sinterable ceramics can also serve as matrix materials.

An example embodying the foregoing is to use steel cores, coated with carbon, or molybdenum disulfide, around which an aluminum matrix is formed. The steel cores are then removed. Another suitable example is to use molybdenum cores, coated with boron nitride, around which a steel matrix is formed. The molybdenum cores are then removed.

Considerations Relating to Ceramic Matrix Material

If the matrix material is composed of a solid state sintered ceramic material, great flexibility in choice of core materials exists. In one embodiment, metal or carbon cores such as are discussed above can be used, if an appropriate core release coating is available, or, if the properties of non-wetting and immiscibility are met, then no core release coating is required. For instance, Fe—Ni alloy (such as Invar®) can be used for a core and alumina can be used as the matrix material. No core release coating is needed.

According to another embodiment, cores that are not high temperature melting point can be used. Typically, ceramic sintered bodies are formed into a green part that is near to the shape of the finished product, by adhering the particles together with a relatively low temperature adhesive, such as polyvinyl alcohol, which is burned away during sintering. Thus, there is an initial, low temperature shape-forming step. The cores for such a body could be of a material that also burns out at the sintering temperatures, such as a polymer. Then, when the adhesive is burned out, the cores would also burn out, leaving channels in their place.

Also by controlling the sintering temperature the designer can make smaller channels than the original cores, as the channels would shrink during the consolidation of sintering. The shrinkage would be between about 30% and about 50% by volume so the diameter reduction is only between about 20% and about 30%. Care must be taken not to sinter at too high a temperature, which could close up the channels.

Taking into account this shrinkage, for sintered products it is possible to make articles having channels as small as 0.0001 in. diameter (0.00025 cm). To arrive at a channel of that very small size, the diameter of the core would need to be approximately 0.00017 in. (0.00043 cm) for 50% shrinkage. Thus very small diameter polymer threads could be used as cores, and then burned out.

In a solid state ceramic sintering process, there could be diffusion bonding in the ceramic between the ceramic particles, by sintering.

The following table illustrates some useful combinations for core base material, matrix forming material and core release coating.

TABLE 3

| Core base material | Matrix forming Material | Core Release Coating |
|---|---|---|
| Stainless Steel | Copper Alloy | Boron nitride |
| Nickel, Chromium, Iron type Alloy, such as Inconel ® | Titanium | Titanium dioxide |
| Steel | Aluminum | Carbon |
| Steel | Aluminum | Molybdenum disulfide |
| Molybdenum | Steel | Boron nitride |
| A First Metal | Many metals that are Imiscible, non-wetting, non-corrosive relative to first | none |
| Carbon | Many metals | none |
| Fe—Ni alloy, such as Invar ® | Alumina | none |

Considerations Regarding Pattern of Core Members

Several considerations bear upon the pattern in which core members are placed. Some relate to issues of fabricating an article, and some relate to issues of using an article. This section deals with issues of fabricating the article.

First, the core members should be placed so that the body material that forms the region 17, shown in FIG. 5, between the core members 36, 38, is not so thin, or otherwise small and fragile, that it tears or rupture, or otherwise fail as the core members are being pulled from the body material. Any such undesired failure would typically be in shear.

The core members also must be located relative to each other so that the body matrix material can be introduced into the spaces between the core members to adequately fill all of the spaces. Thus, they should not be too close. The core members may be moderately interlaced, to some extent, even forming a loose weave or braid, as long as: the curves in the core members are not so severe that they can not be pulled out; and the core members do not touch each other, so that adequate space is provided fully around each core member for matrix forming material, and prevention of shear tearing.

The core members must be located so that at least one end is free to be gripped, with which to pull out the core. For robust manufacturing, both ends of a core should be free, to prevent against failure if one end breaks off, however, the only absolute requirement is that one end be free.

It is also an invention disclosed herein to have a core that does not go all the way through, i.e. a blind ended channel, which is pulled out from its one exposed end. Such an article can be used for acoustic applications (discussed below) or for bullets.

Some Representative Core Patterns

Figure 7:
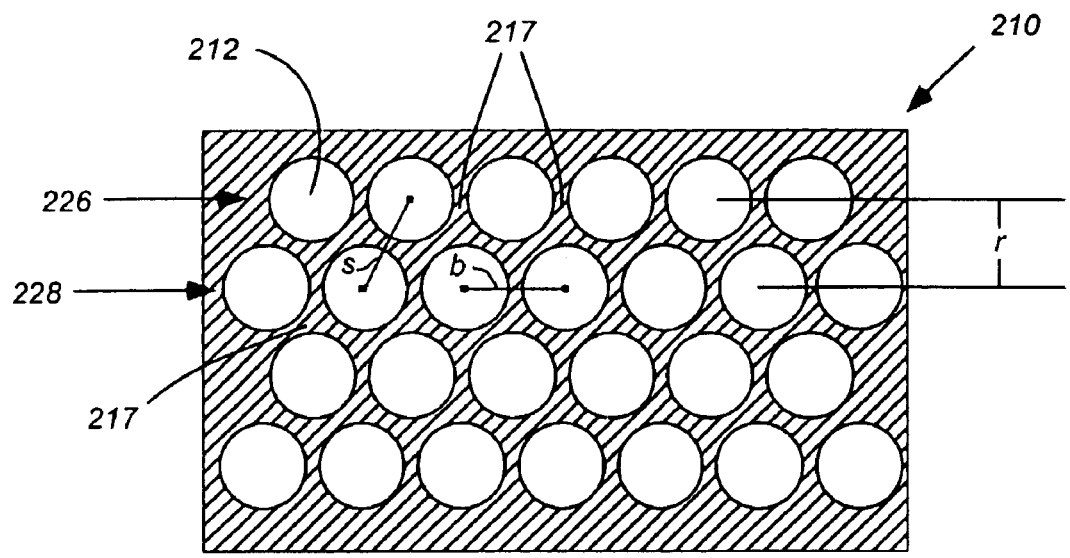
FIG. 7 is a schematic cross sectional view of a five layered, 0 degree, close packed channeled article.

By way of example only, and not to be limiting in any way, some representative core patterns are next explored. In FIG. 7, a channeled article 210 is shown in cross-section, showing an array of channels 212, with regions 217 of body matrix material between the channels. The channels 217 are arranged in a relatively close-packed configuration, with parallel rows 226 and 228 alternating. The rows are offset laterally (left to right) from each other. Consequently, the plane that is tangent to the top surfaces of a row of channels may be closer to the line connecting the centers of the adjacent row, than is the plane that is tangent to the bottom surfaces of the channels of that adjacent row. Thus, rows of channels may be somewhat "nested" within each other's envelopes. This is analogous to a close packed hexagonal array packing in crystallography, or materials terminology. The degree of packing can be adjusted by changing the dimension r, measured perpendicularly between the rows 226 and 228, the distance b, between the centers of adjacent channels in a row. The distance s between centers of adjacent channels in adjacent rows is determined by r and b, assuming equal spacing between rows, and within a row.

Figure 8:
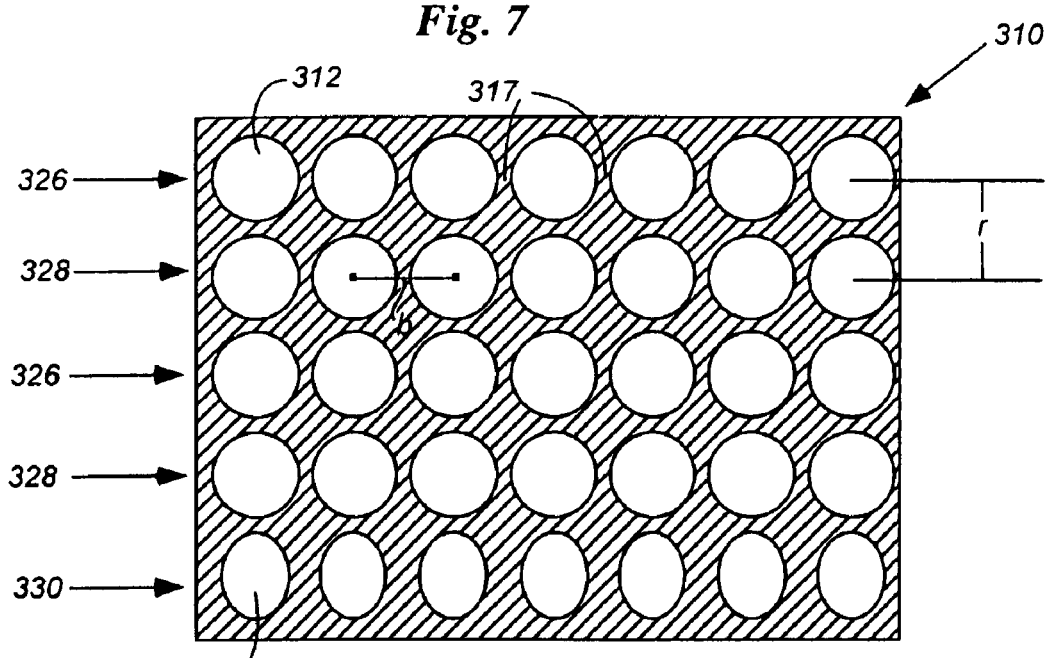
FIG. 8 is a schematic cross sectional view of a five layered, wide packed channeled article with four layers in 0 degree layers and one layer in an angled layup.

An alternate, more open packing configuration (also referred to herein as "equipacking") is shown schematically in FIG. 8. Rows 328 are spaced a distance r from rows 328. The rows 326 and 328 are oriented relative to the overall body of the article 310 identically to each other. There is no "nesting" of adjacent rows of channels. The arrangement of channels is generally rectangular.

The foregoing two examples are illustrative only. Any arrangement of channels that can be made by pulling out cores, as described above, is within the purview of an invention disclosed herein.

The smallest channels that could be made with these techniques using metal wire would use a strong wire, such as molybdenum, or tungsten or a high performance stainless steel.

These metal wires can be drawn to a tensile strength of approximately 350,000 psi. Assuming that the force required to remove a one inch long wire is on the order of 20 lbs. (100N), wire of as small as 0.001 in. (0.0025 cm) could be removed, to provide channels of that diameter, with an aspect ratio of approximately 1000:1. Of course, larger diameter wire can also be used, as needed to provide the desired channel diameter.

The smallest channels that would be made using this technique, in general, with presently available materials, would be made using carbon fibers. Carbon fiber can be used even as small as 0.000075 in. (0.000191 cm).

The smallest spaces between channels depends on the shear strength of the matrix material. It is estimated that a steel matrix having solid regions of as thin as 0.004 in. (0.01 cm) would withstand shear stresses. At this proximity, core infiltration and packing sintering material becomes very challenging, so it is likely that the shear strength will not be the limiting factor. There is no upper bound to the size of spaces between channels that would be imposed by fabrication issues.

Channeled articles have been built with 0.013 in (0.033 cm) channel diameters (circular cross-section) and spacing of 0.009 in. (0.023 cm) between core members (measured within a single row, between the closest points on adjacent core members) with 0.022 in. (0.056 cm) center-to-center. It is possible to make channeled articles with practically any cross-sectional size of cores larger than the minimums expressed above for different circumstances. Articles with relatively closely spaced, small diameter channels have particular commercial usefulness. The largest practical channel diameter size is approximately 0.125 in (0.32 cm). Although articles can physically be made with channels larger than that, it is likely more economical to make them using conventional machining, such as drilling. On the same note, layup of core arrays will be rather difficult for channel sizes below 0.0005 in. diameter (0.0013 cm), although, for some applications, it may be worth overcoming these difficulties.

The layups shown in FIG. 7 are all in the 0 degree direction. As is discussed above with respect to two layers, and FIGS. 1 and 5, if the channels are spaced such that the bottom of the channels in a first layer 328 is above the top of the channels in an adjacent layer 330, such as shown in FIG. 8, but not FIG. 7, then adjacent layers of cores, and resulting channels, can be offset at any angle between 0 and 90 degrees. The channels of row 330 (FIG. 8) are offset at an angle. This is indicated by the fact that the cross-section of the channels 311 (which were made by circular cross-section cores) are seen as ellipses, rather than circles. These varying layups can be exploited to control features of the flow path of heat transfer fluids through the channels, strength and energy dissipation properties of the finished article, etc.

Figure 9:
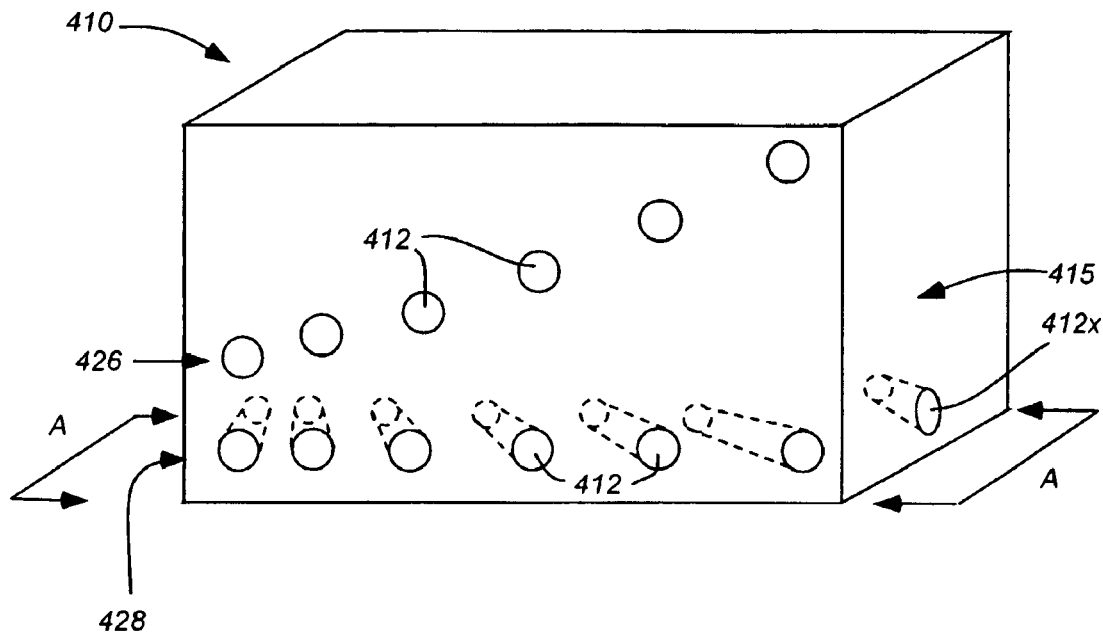
FIG. 9 is a schematic perspective representation of a channeled article having two sets of channels, each skewed in two dimensions, and also skewed from each other in a third dimension.
Figure 9A:
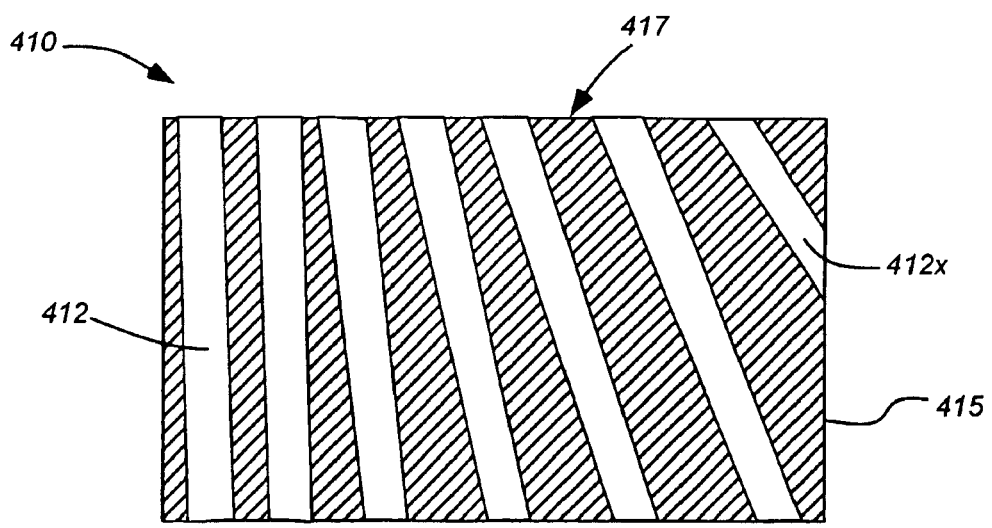
FIG. 9A is a cross-sectioned view of the article shown in FIG. 9, cut along lines A—A.

FIG. 9 shows, schematically, a three-dimensional view of a channeled article 410, having channels 412, arranged in two skewed rows 426 and 428. Within both rows 426 and 428, the spacing between adjacent channels 412 is not uniform, being skewed toward larger spacing on the right, as shown. Further, the spacing between corresponding channels in rows 426 and 428 is not uniform, also being skewed toward larger spacing on the right, as shown. Further, the channels need not run parallel to each other, or perpendicular to the general outer surfaces of the article 410. FIG. 9A shows a cross-sectional view of the article 410, taken at lines A—A of FIG. 9. The channels 412 are not parallel to each other, and they are not perpendicular to the walls 413, 415 and 417 of the article 410. In fact, one channel, 412x does not even pass through a pair of opposite walls of the article 410, rather passing through adjacent walls 417 and 415.

Figure 10:
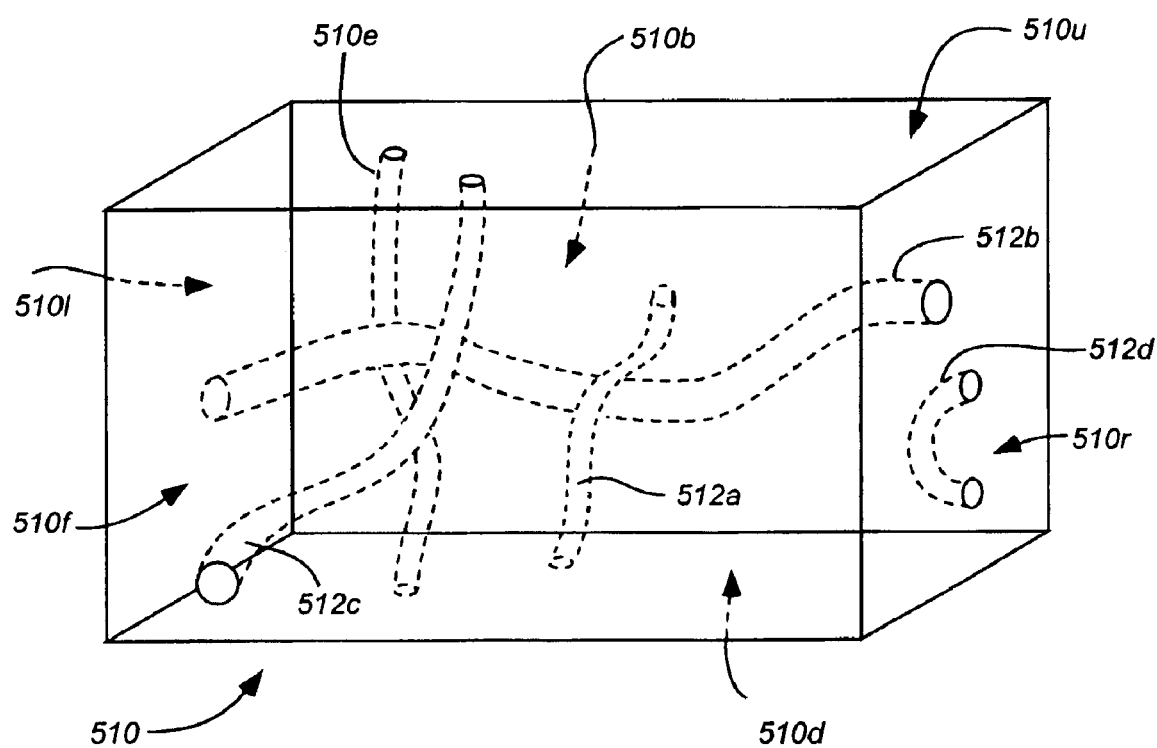
FIG. 10 is a schematic see-through three-dimensional view of a channeled article having channels that are in an irregular pattern.

FIG. 10 shows, schematically, additional special cases of channel configuration and relation to other channels. Any individual channel can be arcuately curved, in whole or in part. Any individual channel can curve around any other individual channel, as does channel 512a, around channel 512b. Channels can pass from a surface of an article: to a generally opposite surface, such as does channel 512b, passing from left surface 510l to right surface 510r; to a generally adjacent surface, such as does channel 512c, passing from front surface 510f to upper surface 510u or even; to the same surface, such as does channel 512d, passing from one part of right side surface 510r to another part of the same surface.

The foregoing variations can be combined with the variations shown in FIGS. 7 and 8 of packing density, and FIG. 9 of two and three dimensional skew of spacing, to achieve virtually limitless variations of channel paths and relationships. The basic requirements that must be met are that the cores must not be so curved or interlocked that they cannot be pulled out, and the cores must be spaced sufficiently from each other so that the intervening matrix body can form, and not deform when the cores are pulled out.

Properties of Channeled Articles and Application for their Use

A channeled article such as described above, made according to any of the methods described above, can be used in many different applications. Such an article can be made with tailored thermal transmission, and acoustic and energy absorption properties. These properties can be exploited in many applications, including, but not limited to heat sinks, military stealth craft construction, lightweight material, protective materials, just to name a few.

Heat Sinks

Taking first the application of a heat sink, such as for semiconductor devices, many advantages are provided. The heat sink dissipates a very high power density. This method can produce heat sinks with channels having very large aspect ratios of length to cross-section diameter, as compared to known techniques. For non-circular channels, a suitable aspect ratio to consider is length to perimeter. Tube-walled articles, as discussed below, and devices made according to that technique, can also be used as heat sinks, as is also discussed below.) The channels also can have very small diameter cross-sections, or, if not circular, very small area cross-sections. And, channels can be spaced relatively closely together.

Figure 6A:
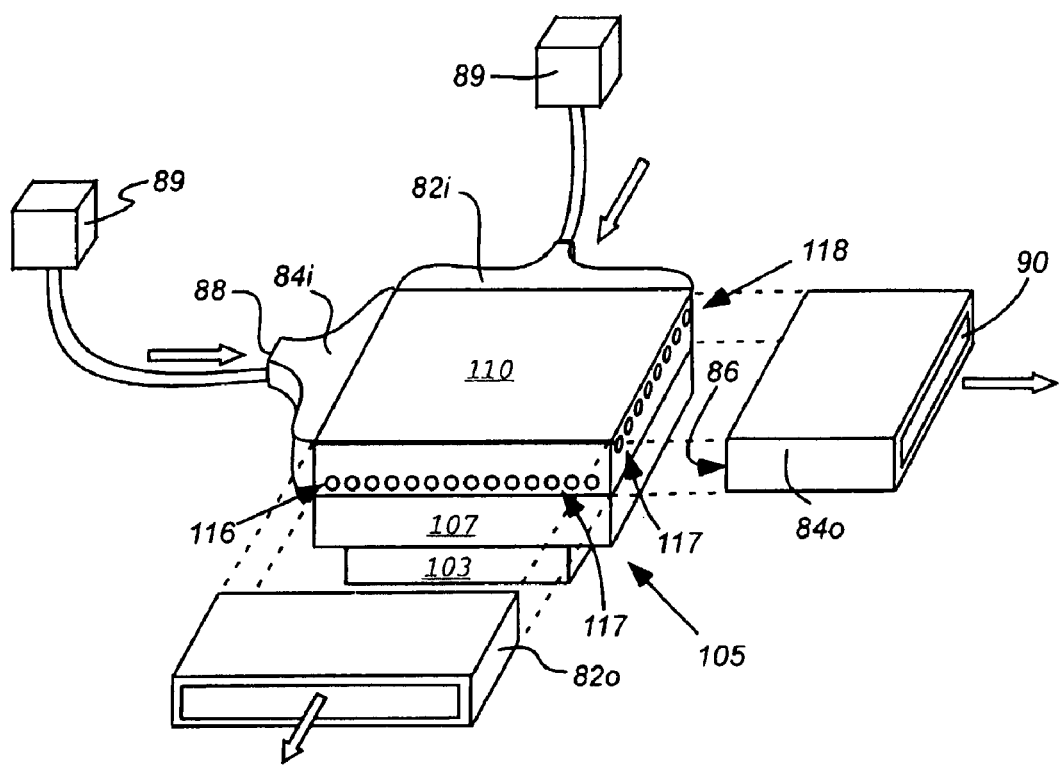
FIG. 6A is a schematic, perspective view of a channeled article fitted with input and output manifolds for the application of heat transfer fluid therethrough, fitted to a semiconductor package, including a semiconductor device and heat spreader, having channels that may be tube walled or tubeless.

FIG. 6A shows, schematically, a channeled article 110, fixed to a generic semiconductor package 105, for heat transfer from the semiconductor package 105 to the heat sink 110 and beyond. A heat spreader 107 is fixed to a semiconductor chip 103, and the heat sink 110 is coupled to the heat spreader 107. The heat sink 110 has channels arranged in two orthogonal sets, 116 and 118, for instance made by the technique discussed above.

For each plurality of channels 116 and 118, a pair of manifolds, 82i and 82o and 84i and 84o, respectively, are connected to the plurality of channels for the transmission of heat transfer fluid therethrough. As shown, the manifolds 82i and 84i provide input for heat transfer fluid to the channeled article 110, and the manifolds 82o and 84o provide output from the channeled article. The manifolds can be plastic or metal. The manifolds are secured to the channeled article by any suitable means, including adhesive, mechanical clamping (releasable or permanent), welding, or other metallurgical process such as brazing, soldering, etc. A compressor 89 compresses the air, or other heat transfer fluid, and forces it into the manifold and through the channeled article. The output manifolds vent the fluid to the atmosphere.

Thus, the channeled article 110, as a heat sink is secured to the semi-conductor package 105. Heat transfer fluid is pumped by a compressor 89 into the input manifolds 82i and 84i, flows through the channeled article 110 where it picks up heat that has conducted through the body of the channeled article 110, from contact with the semi-conductor device. The heated heat transfer fluid exits to the atmosphere through the output manifolds, from which it is discarded, or cooled and recycled. The heat transfer fluid can be any suitable fluid that does not adversely react with the material of the body of the article 110 including but not limited to water, air, helium, etc. Thus, heat is transferred from the semi-conductor device. Heat is transferred very efficiently through the thin layer 117 between the heat spreader 107 and the heat exchange channels 116, 117.

Figure 6B:
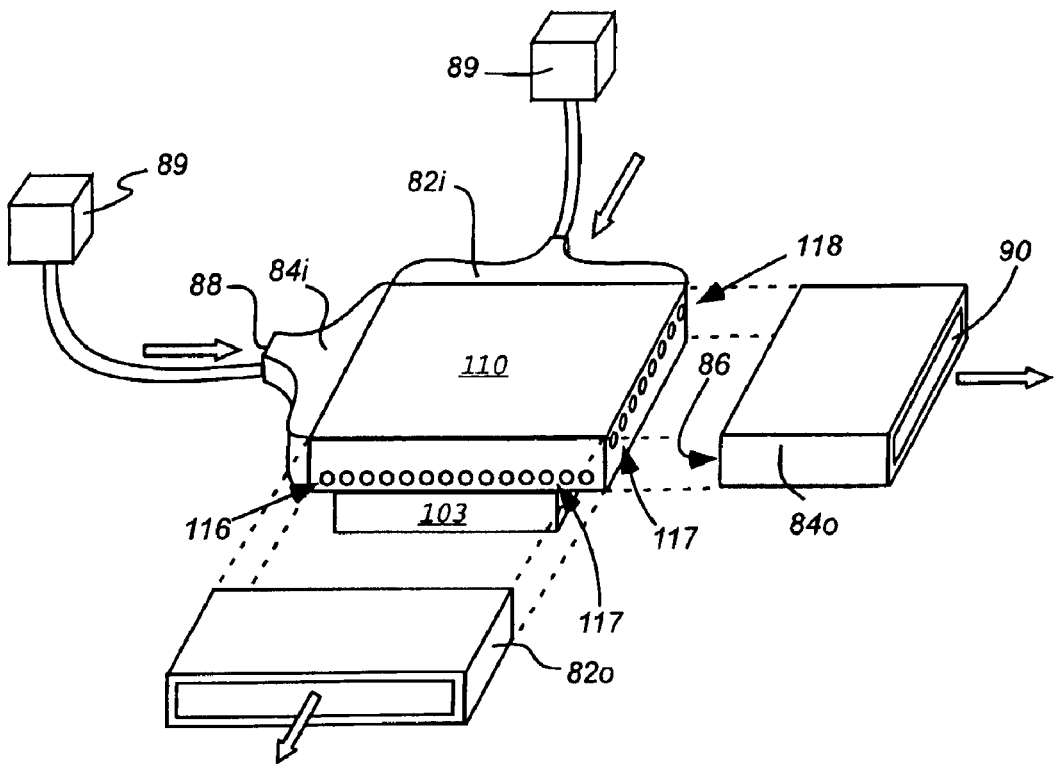
FIG. 6B is a schematic perspective view of a channeled article used with a semiconductor package similar to that shown in FIG. 6A, without a separate heat spreader, where the channeled article is integral with the semiconductor device.

An alternative version is shown in FIG. 6B, where the channeled article 110 is integral with the semiconductor device 103, and essentially takes the place of a heat spreader. This is more efficient for heat transfer purposes, and can be fabricated more economically and efficiently.

This form of active heat transfer can increase the cooling or heat transfer capacity by changing various parameters. These include: the heat transfer fluid, the volume flow rate of the heat transfer fluid, channel diameter, shape, spacing and length. Heat transfer is also increased, in general, for each channel, by decreasing the diameter of the channel. Heat transfer is further increased, in general, by packing more channels per unit cross-sectional area of the channeled article, up to a limit, beyond which heat transfer decreases (typically because the pressure needed to feed the fluid becomes prohibitive). For a discussion of the effect of geometry of heat sinks on the heat transfer properties, see, general, Weisberg, A, and Bau, H. H., Analysis of microchannels for integrated cooling, Int. J. of Heat Mass Transfer, V. 35, No. 10, pp. 21465–2474 (1992) (Pergamon Press Ltd. (Great Britain).

An advantage of channeled articles is that the associated heat flow can be modeled using conventional finite element analysis techniques. Proper parameters to allow accurate, consistent heat flow modeling using commercially produced software can be developed for these articles. Such accurate modeling parameters enables future engineering heat management applications that could not otherwise be attempted, such as refrigeration and turbine design.

Further, in accordance to Fick's law, heat can travel very quickly through relatively thin metal layers, such as the region 117 between the semiconductor device and the open channel. (Fick's law is that heat resistance builds according to the distance that heat has to travel through a material. Thus, for a thin layer, heat meets very little resistance and travels quickly.) Thus, the channeled articles disclosed herein are able to move heat away very quickly, and thus, are very efficient. Most importantly, heat transfer fluid can be forced through the channels. The heat transfer fluid can transport more heat away from the heat sink, than would be the case with a passive device, such as a finned heat sink. The fluid can be a liquid, such as water or a gas, including, but not limited to air, or helium.

Current (year 2002) semiconductor chips require up to 30 watt/cm$^2$ of heat dissipation (which is about the maximum that can be currently provided), and, of course, greater intensities are now desired and will be required in the future. Many mainframe and tower systems include refrigerated cabinets, and, even so, still require close control of their surroundings. The best currently available commercial heat sinks for comparable power densities are bulky, with a typical heat sink for a 30 watt/cm$^2$ chip occupying on the order of 885 cm$^3$ (54 in$^3$).

As an example, using the channeled article for a heat sink, air, pressurized to five atmospheres (75 psi) is flowed through the channels. As the air enters, it speeds up according to Rayleigh flow parameters, and is able to flow much faster than typical, fan forced airflow in conventional heat sinks. This is because of the significant pressure drop through the tubes, when exhausted into the atmosphere, as compared to less constrained flow paths in conventional arrangements. Because the channels provide for a total larger surface area than simply the body of the matrix material alone and symmetric thermal convection (forced) into the air and conductance through the metal offered by the circular cross-section hollow channel, the high speed air is heated rapidly, and cools the body of the channeled article.

A channeled article made according to the methods discussed above, having 0.013 in. (0.033 cm) diameter circular cross-section channels, spaced apart on 0.022 in. (0.056 cm) centers made from tin matrix body can dissipate over 60 watts/cm$^2$, in an extremely compact body when connected to a compressor as above and exhausted into the atmosphere.

For instance, including a pair of input and output manifolds, such as discussed above, with two sets of orthogonal channels, the volume is on the order of 0.187 in.$^3$ (3.07 cm$^3$).

The foregoing example uses tin for the body matrix material. Using a higher melting temperature material, and higher thermal conductivity material dissipate much more power. For instance, it is estimated that a copper matrix material body of similar dimensions, under similar conditions, would be able to dissipate at least 250 watts/cm$^2$.

Such a channeled article can be adhered to a semiconductor device using clips, and silicone grease or silicon pads. It is also beneficial to use a metallurgical bond (such as brazing, soldering, etc.), rather than the clips, which eliminates the need for silicone grease, and the inherent losses in heat transfer due to interfacial resistance at the grease layer. This facilitates the creation of channeled article substrates for semiconductor chip production, effectively making heat sinks integral parts of a next generation semiconductor, and facilitating packaging.

Patterned lithographed braze interlayer and $C_{TE}$ (coefficient thermal expansion) technology, developed by the assignee hereof, Massachusetts Institute of Technology, can be used to make such channeled article chip packages and to deal with thermal expansion mismatch between semiconductors and integral heat sinks. See (Park, Jin Woo, *A Framework for Designing Interlayers in Ceramic-to-Metal Joints*, Doctoral Thesis, Department of Materials Science and Engineering, MIT, 2002), which is incorporated herein by reference.

Large chips made with current heat sink technology are subject to cracking under thermal strain. Chips that have integral heat sink packages can be larger than is presently convenient. Such larger chips could enable multifunction nanotechnology, such as integrated optical and electronic operation. Improved heat sink function also has a beneficial effect on the service life of semiconductors, because integral cooling minimizes common fatigue cycles caused by thermal expansion. Integral cooling of semiconductors also has advantages for technologies that require lightweight semiconductor assemblies, such as satellites and missile carried apparatus.

If the thermal expansion mismatch is handled with patterned braze interlayer, then a channeled article as described herein can replace an integral heat spreader 107, such as is included in high performance microprocessor chip packages.

Ultra Lightweight Anisotropic Structural Parts

Channeled articles, as described above, can also be used as part of ultra lightweight, anisotropic, structural parts. An important feature of traditional long fiber composite parts is their anisotropic nature. High performance carbon fiber composite parts are often designed to be very strong in high load directions, while being not so strong in other directions, that are subject to lower loads. This anisotropy in strength requirements permits an anisotropy in construction, and the possibility of overall lighter weight. Channeled articles, as described above, fabricated from metal, provide the potential to design anisotropic metal parts, which are strong in desired directions, and also relatively lightweight, as compared to traditional isotropic metal parts. Controlled channel locations, in areas that are not on the major load axis, can result in reduced weight. Typically, the channels are aligned with their long axis, and thus, the long axis of the remaining metal between channels, along the axis of expected stress.

Figure 11:
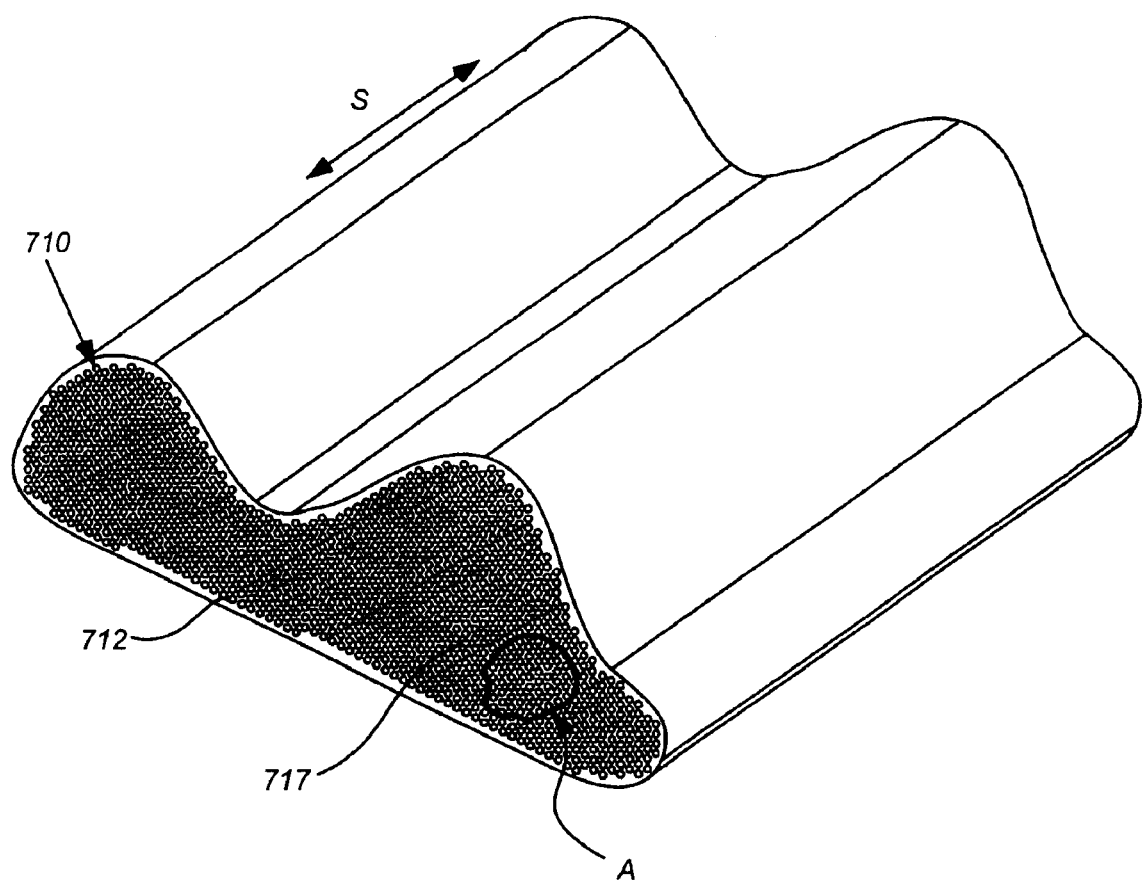
FIG. 11 is a schematic representation of a channeled article fashioned in a complex shape for specialized use, such as a lightweight aeronautic part.
Figure 12:
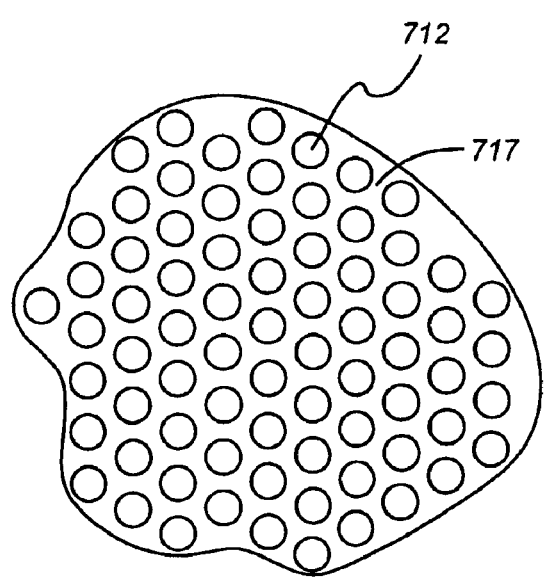
FIG. 12 is a blown up portion A of the part shown in FIG. 11.

For instance, as shown schematically in FIGS. 11 and 12, a channeled article 710 may be used as a hinge, or other component in a lightweight application. (FIG. 11 does not necessarily show a hinge. It shows an arbitrary, irregular shape.) The expected stresses are expected to be highest parallel to the double headed arrow S, and much lower in any other direction. The channels 712 are aligned with their long axes parallel to the arrow S. Thus, also aligned with the arrow S are the long extents of solid material 717, which remain after the cores that were used to make the article, are pulled out. FIG. 12 shows a blow up of portion A of FIG. 11.

The shape shown is for illustration purposes only, and is a simple shape, with only generally one axis of elongation. More complex shapes could be made, which take advantage of the techniques mentioned above, incorporating curved channels, and modestly interwoven channels. Such parts would typically have regions where a plurality of channels are congruent, or parallel to each other, but not to similarly congruent groups of channels in other regions. Parts that would enjoy a significant benefit from anisotropic design are those that are constrained to be a certain size, but are subject to low overall loads relative to their size, or to very directional loads. In other words, the strength of a solid part of the required size and geometry would be more than is necessary, and thus, so would be the mass.

One illustrative example is a component of an airliner door hinge. Hinges must be large enough to allow for opening and closing of doors, but are not subject to heavy loads. They have a complex shape, which does not lend itself to construction by non-metallic composites, such as carbon or polymer fibers. Because they are subject to only relatively directional loading, they can be significantly lightened if constructed of a metal channeled article, as described above.

It is possible to take advantage of specialized properties of specialty alloy systems, and to make the body of the channeled article from specialty alloy systems, such as magnesium, aluminum and titanium. Fabrication from such alloys depends upon the proper selection of core release coating layers, and the method of densification, for instance, liquid infiltration diffusion bonding. For instance, zinc can be used to infiltrate an aluminum sintered body. Nickel copper alloy can be used for a titanium sintered body.

It is typically the case that the ratio of tensile strength of the core material compared to the force required to remove it from the specific matrix environment, is the factor that limits the upper bound of the aspect ratio for most channeled article structural parts. Frictional force increases with area, and hence, with length of the core members. This ratio may be managed by providing lubricating layers for the core-release material, such as boron nitride powder and also by selecting systems of core material and matrix material that will become the body, having compatible coefficients of thermal expansion. By "compatible," it is meant a core with a $C_{TE}$ larger than the matrix. Thus, the core will shrink more as it cools than will the matrix, thus, releasing more easily. (This ratio is also a potential issue with other applications, such as heat sinks. However, it is more typical in heat sink applications for issues of fluid flow, heat transfer, blockage of the channels with contaminants, etc. to limit the needed aspect ratio of the channels.

Lightweight Energy Absorbing Armor and Structural Components

Channeled metal articles can also be used for energy absorbing applications, such as armor and protective structural components. Just as foamed polymers are used as safety devices in helmets and automobile bumpers, channeled metal articles can be structured and used to absorb enormous amounts of energy upon crushing. Energy is dissipated as it initiates crushing in each open region of a channeled metal article. Energy is also absorbed as it passes from an open region to a solid metal region. Channeled articles can be made with precise location of channels and other geometries within the body. Thus, the crushing and energy absorption properties of a channeled article can be more specifically controlled than can that of random porosity polymer foams.

The channels of channeled articles can also be filled with an impact activated explosive. Thus, if used in armor, when impacted by a projectile, the explosive goes off, and disrupts the flow of energy from the projectile to the target. This type of device is sometimes referred to as "active armor."

Within the automobile industry, considerable research has been conducted regarding providing crush zones that will divert energy away from the passenger cabin. The controllable location of channels of channeled articles, inherently diverts energy along predictable pathways. Crush energy travels preferentially in the direction of elongation of the channels. Thus, vehicle engineers can fabricate parts with channels provided in directions to facilitate predictable, controllable (in advance) local and global crushing in a structure, upon impact.

In addition to vehicle crash safety (automobile, truck, snow mobile, boat, powered personal water craft, farm equipment, etc.) the foregoing considerations are applicable to protective ballistic armor, for vehicles, machines, and even for persons. Controllable local and global crushing of channeled articles, as well as engineerable energy dissipation patterns, facilitates an article made of channeled material to prevent or impede (slow down) ballistic projectile penetration.

Furthermore, the low mass-to-volume ratio of channeled articles allows the use of inherently stronger materials in weight sensitive applications, than is currently possible. For instance, an article that has traditionally been made from aluminum, can now be made from a lightweight channeled article made from a stainless steel. The hardness properties of the steel, combined with the toughness and energy direction and dissipation properties of a channeled article design, may enable a more effective armor than can be made of solid aluminum.

Acoustic Properties of Films and Sheets

Conventional laminate composites have shown great capacity for stealth design, namely, for the fabrication of structures that are difficult to detect with radar, sonar and other conventional surveillance detection systems. This is because anisotropic systems can deflect and absorb sound and radar waves in ways that solid materials cannot. Laminate layers diffuse energy as it flows through them. Both tubeless and tube-walled channeled articles (discussed below) offer these same diffusion characteristics, with the durability and unique acoustic properties of metals. The elongated porous areas of channeled articles can also be filled with an elastomer or a fluid, adding another degree of freedom in acoustic design.

The channeled articles disclosed herein can be manufactured in thin, lightweight film or sheet form. Film or sheet can be bonded to existing structures to give them engineered acoustic properties (e.g. stealthiness), with minimal weight and drag penalties.

Acoustic testing of panels including channeled articles has shown that there are novel acoustic dissipation properties inherent in channeled anisotropic designs. Thus, such channeled articles can be incorporated into the bodies of military and espionage vehicles, particularly but not only aircraft, to produce deceptive sonar and radar signatures.

Channeled Articles Having Tubed Walls

The foregoing discussion has focused on channeled articles that are fabricated by forming an article around a network of solid core members, and then removing the core members after a channeled article has been formed. Such articles are referred to herein generally as tubeless articles. It is also possible to form an article around a network of hollow core members, also referred to as tubes, and to leave the hollow core members in the article after it has been formed. In that case, the hollow regions of the hollow core members become the channels of a channeled article. Such articles where the core members remain in place are called "tube-walled" articles. There are similarities with and differences from such channeled articles with tubed walls as compared to tubeless articles, discussed above, in their methods of fabrication, configuration of properties and applications for the final product.

FIG. 17 shows, schematically, in perspective view, an article 610 that has been formed using hollow tubes, rather than solid core members. The article has a body portion 614, and open channels 612, which pass through the body portion. In this case, two pluralities 616 and 618 of channels 612 are shown. The channels are bounded by annular tubes 613, which are embedded in the body portion 614, and pass fully therethrough also. The final article is superficially similar to the tubeless channeled article 10, shown in FIG. 1, except for the tubes 613 that form the walls of the channels 612. Typically, in a finished article, the tubes 613, are cut-off flush with the surface of the article 610.

Fabrication of the tube-walled channeled article 610 can be done in a similar fashion to that of the tube-less channeled article 10 discussed above. Elongated tubes 613, such as, for instance, steel hypodermic needles, are secured in a fixture similar to that shown in FIG. 4, and molding matrix material is introduced into the mold. In general, molding material can be introduced in the same ways as discussed above. The material may be molten metal such as is discussed in the liquid state section. It can be introduced as in die-casting, under positive, or vacuum pressure. Powder metallurgy techniques, such as sintering, as mentioned above in the solid state section, are also possible with tube-walled channeled articles. A liquid infiltration diffusion bonding technique can be used, as discussed in the hybrid liquid/solid state section, above. One major difference between channeled articles with tube-walls, and those without, lies in the function of a coating applied to the core members.

The following discussion initially addresses a liquid state fabrication technique, and then discusses solid state and hybrid liquid solid state techniques, and how they differ.

Coating for Hollow Core Members

Channeled articles with tube-walls retain the tubular core members that are used for their fabrication, rather than having them removed. Thus, the process of their fabrication must insure that they are retained, rather than insure that they can be pulled out. One way to insure retention is by selection of a core retention coating. A core retention coating must provide a strong bond between the hollow core member and the surrounding matrix material. It must also protect the core member against liquid erosion that would be caused if molten material and the core members are miscible, as discussed above in connection with solid core members.

(For instance, if the two metals are identical, then they are miscible. Such an article is useful for some applications, since it provides relatively uniform properties.) The coating should also prevent corrosion of the core from occurring. It is also helpful for the coating to dissolve any oxides residing on the core material surface, because a better bond arises between the core member, and the matrix material if no oxides are present. These functions are explained in more detail below.

Figure 18:
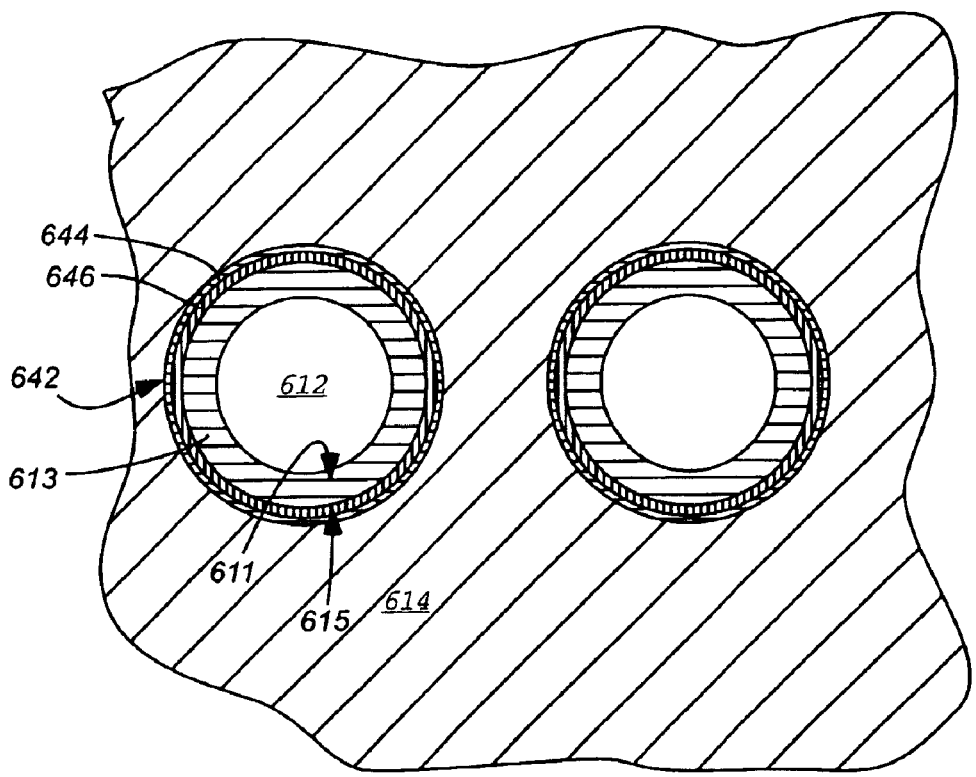
FIG. 18 is a schematic cross-sectional view of portion of a precursor to a tube walled channeled article shown in FIG. 17, surrounded by molten molding material, showing the coated, hollow tubular core members.

FIG. 18 shows a cross-sectional view of a preliminary stage in formation of a tube-walled channeled article. A hollow tube 613 has an inner, hollow region 612, that is bounded by an inner wall 611. The inner wall 611 forms one wall of a solid annulus, having an outer wall 615. The outer wall 615 is provided with a coating 642, which is initially made up of an outer layer 644 and an inner layer 646 (also referred to herein as an "interlayer"). Surrounding the tube 613 and its coatings is a forming matrix body portion 614. The matrix body portion 614 is formed by any suitable means, as discussed above, including liquid state, such as die-casting, metal injection molding. (Solid state and hybrid solid/liquid state are discussed below. FIG. 18 is primarily designed for discussion of the liquid state case, but is also somewhat helpful for understanding solid and hybrid state method.) FIG. 18 is not to scale. In actuality, the coating layers 644 and 646 are much thinner that the tube 613 wall.

It should be understood that the coating 642 is shown idealized, before any interaction takes place between the coating 642 and the surrounding matrix material 614, or the tube 613. During the processing of the body, to provide a solidified, dense body, the matrix material 614 and the coatings 642 interact, as described below. A liquid state technique is described first.

The inner coating layer 646 dissolves any oxides that are present on the surface 615 of the tubular core member 613. This enhances the bond to be formed between the matrix material and the tube 613. The inner layer 646 protects the tubular core material 613 from being eroded by the matrix material 614, when molten, if the core material and the matrix material are miscible, or if one is miscible in the other. The outer coating layer 644 enables the matrix material 614, if molten, to effectively wet the surface 615 of the tubular core members 613, and conforms closely to their shape. The outer layer 644 bonds strongly to the molten matrix material 614. Typically, such strong bonding is established by providing an outer layer 644 that is similar, or identical, to the matrix material 614. (By "similar," it is meant alloys having substantially the same alloying elements, in close, but not necessarily exactly the same proportions.)

As the outer layer 644 melts into the similar matrix material, it draws the molten matrix material to wet the inner layer 646. Because the system is still hot after wetting, the inner layer 646 diffuses into the tube 613 and the matrix material 614. Thus, initial wetting occurs on the outer layer 644, which quickly melts and makes the liquid matrix material 614 wet the inner layer 646, which then diffuses, effectively making the liquid matrix material 614 wet the surface 615 of the tube 613. After the molten material 614 has been provided and assumed the desired shape, it solidifies, over time. An inner layer 646 is rarely present as a layer after the liquid matrix material solidifies because of this diffusion. It is a temporary layer to assist in wetting.

Figure 19:
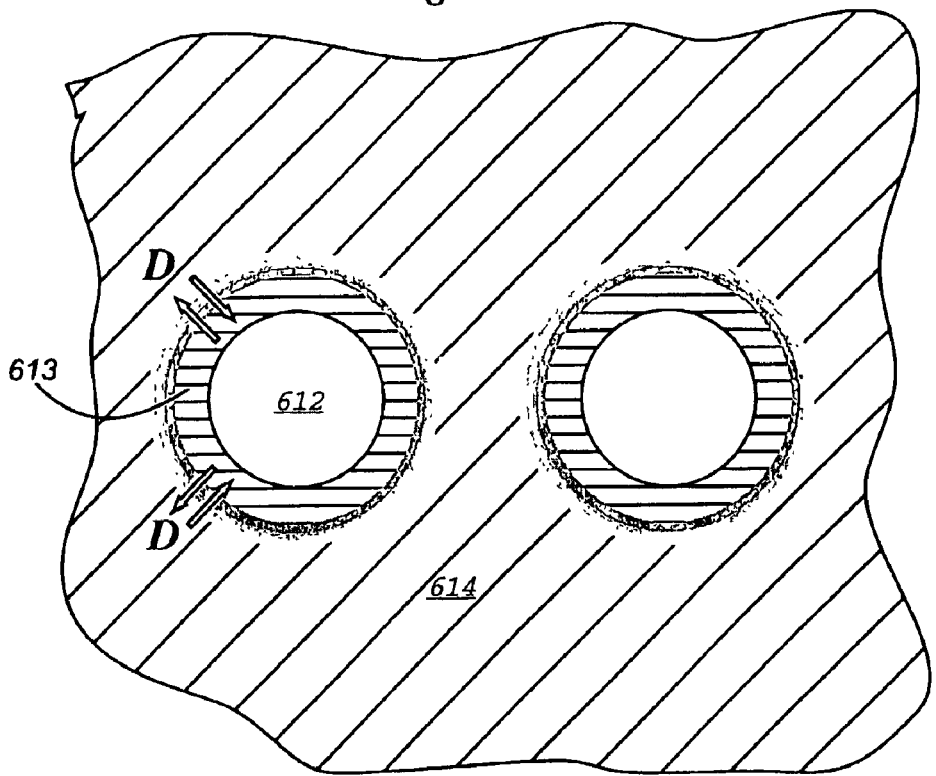
FIG. 19 is a schematic cross-sectional view of the portion of a finished channeled article shown in FIG. 18, after solidification of the molding material.

With reference to FIG. 19, an illustrative example is with a matrix material 614 of tin, and embedded tubes 613 of stainless steel, with a wall thickness of 0.003 in. (0.008 cm). The outer coating layer 644 is also tin, and the inner coating layer 646 is nickel. Under the temperature conditions of molding with molten tin, the outer layer 644 of tin melts in the molten tin matrix material 614, while wetting the inner coating layer 646 of nickel. The molten tin matrix material 614 is then drawn into the spaces between the tubular core members 613 by capillary action (analogous to the spaces 23 between the solid core members shown in FIG. 4). By flowing in one direction (downward into the network of core members), all porosity is swept ahead of the molten metal, which is forming the matrix. Subsequent heating causes the nickel interlayer 646 to diffuse into both the stainless steel of the tubular members 613 and the infiltrating molten tin metal that makes up the body matrix 614, effectively allowing the molten liquid to wet the steel core, causing a strong bond between the stainless steel tubes 613 and the surrounding, primarily tin, matrix 614.

FIG. 19 shows schematically, a cross-sectional view of a portion of a tube-walled article 610, after the diffusion has taken place. An annular 304 stainless steel tube 613 is shown, bounding the interior hollow channel 612. The tube is generally surrounded by a solidified tin matrix body 614. Between the tin matrix 614 and the stainless steel tube 613 is a region 648 of gradually varying composition, including diffused nickel from the original inner layer 646. Nickel has diffused both outward, into the tin matrix 614, and inward, into the stainless steel tube 613 as indicated by the arrows D. There might also be small diffusion of tin from the matrix region in toward, and even into the region of the stainless steel tube 613, and diffusion of components of the steel, outward.

Solid State and Hybrid Solid/Liquid State
Fabrication of Tube-Walled Articles

The foregoing discussion has focused on a liquid state fabrication of tube-walled channeled articles. As with tubeless channeled articles, it is also possible to fabricate tube-walled articles using either solid state (sintering) techniques, or hybrid solid/liquid state techniques. Because the hybrid state techniques have more similarities with the liquid state techniques, they are discussed next, followed by solid state. (Due to the similarities with methods that have already been discussed, there are no specific figures for the different tube-walled techniques.)

With a hybrid state fabrication techniques, as discussed above, coated particles are packed around the hollow tube cores. The cores are also coated. The cores are coated with a core retention coating, similar to that described above in connection with the liquid state. The particles are coated, as discussed above in the tubeless discussion of hybrid state techniquies. A liquid infiltrant is provided under pressure, in the same manner is has been described above. The particle coating prevents erosion in the case of miscible metals, as above. The liquid infiltration diffusion bonding works exactly the same as above, in connection with tubeless discussion, to result in a body that is a single phase. The composition is mostly powder base material, with a small amount of formerly liquid infiltrant, and a very small amount of particle coating. The difference is in the operation of the coating on the core.

In the case of a tube-walled article, the coating must function more like the coating described above, in connection with the liquid state tube-walled article shown in FIG. 19. It must, again, protect the metal of the hollow core tubes from erosion that might be caused by contact with the molten infiltration metal, if there is the erodable miscibility relationship between the two. The coating must also protect against any corrosion that might arise due to contact between the coated particles and the hollow core tubes. Additionally, the coating should help to promote a bond between the hollow core tubes and the body of the article, composed of the infiltrated, sintered particles. Thus, typically, the coating on the hollow tube cores will have an outer layer that is of a similar material to the liquid that is infiltrating the sintered body of particles.

Thus, FIGS. 16 and 18 can also help one to understand a hybrid liquid/solid state. Instead of liquid, the matrix material 614 is packed, coated particles, such as are illustrated in FIG. 16A, that will be infiltrated and sintered with liquid infiltration diffusion bonding. The outer coating layer 644 is of a material that is similar to the material that will infiltrate the region 614 as a liquid. The inner coating layer 646 acts as a corrosion and erosion barrier between the liquid of the sintered body, and its particles, on the one hand, and the metal of the tube 613, on the other hand. The melting of the outer layer 644, forming a bond with the liquid of the infiltrated sintered body 614, takes place similarly, as does the diffusion of the inner layer 646 and the ultimate wetting of the tube 613 with the liquid of the infiltrant. Bonding between the matrix material and the core material is also promoted by pressure that is applied to the entire body during infiltration and sintering.

The result is also similar to that shown in FIG. 19, with the difference that the body 614 of the article is a single phase that arose from liquid infiltration diffusion bonding (such as is shown in FIG. 16D), rather than simple liquid state processing, and the diffusion of the core retention coating was into this liquid infiltration diffusion sintered body, rather than a body formed from molten metal.

Turning next to a discussion of solid state sintering, again, hollow tubes are coated with a core retention coating, and sintering particles are packed around them. In this case, the particles are not coated to promote liquid infiltration diffusion bonding, and no liquid infiltrant is used (at this point, at least). (The article could be conventionally infiltrated later, as long as the infiltrant does not dissolve the tubes.) In this case, according to one option, interdiffusion can arise between the metal of the hollow core material, the core retention coating, and the sintering particles. This would typically not provide as strong a bond as arises in either of the techniques exploiting a liquid state, discussed above. However, the bond is adequate.

Another option provides a stronger bond, and exploits a form of transient liquid phase ("TLP") diffusion bonding, to bond the tubes to the matrix during sintering. Transient liquid phase sintering is discussed in general in: McDonald, W D and Eagar, T W, "Transient Liquid Phase Bonding Processes", article in *The Materials Science of Joining*, Cieslak, M J; Peperezko, J H; Kang, S; Glicksman, M E, editors, The Minerals, Metals, and Materials Society, 1992 pp. 93–100; and McDonald, William D. *Kinetics of Transient Liquid Phase Diffusion Bonding*, Doctoral Thesis, submitted to the Department of Materials Science and Engineering, Massachusetts Institute of Technology, 1993. Both of which are incorporated fully herein by reference.

A process analogous to transient liquid phase ("TLP") sintering can be used here. TLP sintering takes advantage of the fact that, as shown in a phase diagram, there is often a temperature region in which an alloy of two metals is liquid, even though each of the constituents alone is solid at the same temperature. So, using this concept, a core retention coating is provided that, when combined with the metal of the sintered particles at approximately the eutectic temperature, passes into one of these liquid regions. Then, the system is put under pressure and temperature, and diffusion is induced. As the core retention coating diffuses into the matrix of sintering particles, at temperature, an alloy is formed, which turns to liquid in the small diffusion area. There is only a relatively very small amount of coating layer, so, it is very thin. This thin liquid layer wets the surface of the hollow tube core, and typically also diffuses, just a little bit, into the metal of the hollow tube core. In liquid state, diffusion moves very quickly, until all of the core retention coating layer diffuses into the surrounding sintered matrix. When diffusion is complete, the fraction of metal that had made up the core retention layer in the surrounding matrix is very small, and the matrix returns to solid state at the interface area with the hollow tube core, creating a very effective bond. This all transpires without changing the temperature of the system. The transformations arise due to the kinetics of the system. It is also possible to pre-diffuse some of the core retention material into the core, as well, which would allow the liquid to interdiffuse more effectively.

Composition Issues

Using the proper coating layers allows more flexibility in matching the metal of the tubular cores, and the matrix, because it permits using metals that are miscible in each other (at least, one, in the other).

Some of the issues of composition of the various parts of the system are the same for tube-walled channels as for tubeless channels. In both cases, it is important that the matrix material not corrode the core member and, if liquid, erode or dissolve. Thus, the coatings that serve as barriers between miscible or corrosive metals can be used for that purpose in both applications, as long as they also do not defeat the different requirements of core removability (tubeless) or core retention (tube-walled), as the case may be.

Erosion with miscible metals can be prevented if a suitable barrier exists between them. This can be achieved by coating the core members. For instance, by coating copper core members with a nickel barrier layer, a network of copper core members can be core infiltrated with molten silver to form a silver body matrix. By holding the composite at high temperature for a short time, on the order of a minute, a single-phase alloy is formed. As the nickel diffuses into the solid copper, the liquid silver diffuses into the copper (with dilute nickel) core members, forming a single phase transient liquid phase diffusion bond. A possible drawback of this example, is the quick dissolution of copper in silver, upon contact. Thus, the nickel coating must be thick enough to prevent their contact until full infiltration has occurred. It is estimated that a plating of about 0.004 in. (0.01 cm) would be adequate.

Another suitable combination is to use nickel for the core tube base material, and to use copper as the matrix material. If the nickel core is coated with tin, the copper matrix material will not corrode or erode the tubes, and will bond to them.

Nickel is an excellent barrier metal for copper alloys. For instance, the brass alloy components aluminum, tin and zinc diffuse slowly into nickel. Thus, copper tubes can be coated with nickel, and then brass matrix material can be formed around the nickel coated copper tubes.

For nickel alloys (used as either the tubes or the matrix material), aluminum will form transient intermetallic barriers that slow erosion and can permit full infiltration of molten matrix material before the core material is eroded. Also, for titanium alloys, aluminum will form transient intermetallic barriers that will slow erosion and permit infiltration of molten matrix material before the core material is eroded.

Ceramic Matrix Material

The matrix material in tube-walled channeled articles can also be ceramic, as discussed above. As discussed above, typically, ceramic sintered bodies are formed into a green part that is near to the shape of the finished product, but adhering the particles together with a relatively low temperature adhesive, such as polyvinyl alcohol, which is burned away during sintering. For tube-walled products, if tubular cores that are retained are used, there could be diffusion bonding between the sintering particles and the hollow cores, depending on their composition and any surface pretreatment of the cores. The diffusion bonding can occur between ceramics alone, and also between metals and ceramics, together, if under high temperature and pressure. Thus, various combinations of materials are possible.

A suitable ceramic to use for the matrix material is alumina, and Fe—Ni alloy, such as Invar®, can be used for the hollow tube cores. A single core retention layer of an alloy of copper, titanium and silver can be used.

The following table illustrates some of the possible combinations that can be used. (A blank or "none" indicates that another material may be used, but it is not necessary.)

TABLE 4

| Core base material | Matrix Material | Core retention Coating | |
|---|---|---|---|
| | | Inner | Outer |
| SS 304 | Tin | Nickel | Tin |
| Nickel | Copper | None | Tin |
| Steel | Aluminum | None | none |
| Stainless Steel | Aluminum | Galvanized zinc | |
| Stainless Steel | Fe—Ni alloy, such as Invar ® | Electroless Nickel (Nickel Phosphorous Braze) | |
| Aluminum | Tin | Aluminum oxide (anodized) | |
| Aluminum | Lead | Aluminum oxide (anodized) | |
| Titanium | Zinc | Titanium oxide (anodized) | |
| Titanium | Copper | Titanium oxide | |
| Invar ® (Fe—Ni) | Alumina | Copper-Titanium-Silver alloy | |

Cases where No Coating is Required for Tube-Walled Structure

In some cases, no coating is required for tube-walled articles. As is discussed above, the coating is used to prevent corrosion and erosion, and to promote bonding. Typically, if the materials are miscible, then erosion is a potential problem. If the matrix forming material does not wet the core material, then bonding is not promoted. However, if the matrix forming material and the core material can satisfy the other use and processing needs of the article, and erosion and corrosion are not problems, and an adequate bond arises without a coating, then no coating is necessary.

This would typically only be the case if the matrix forming material wets the base core material, and if they are not miscible. For instance, using nickel for the core members, and copper for the matrix material, would not require a coating. If the materials are taken to a high temperature and pressure, they will diffusion bond. Similarly, using carbon steel for the core members and aluminum for the matrix material would not require a coating.

Structure of Resultant Tube-Walled Article

A tube-walled article is similar in some respects to a tubeless article, and different in others. The tube walled article is not homogeneous in composition, as is the tubeless article. Rather, it will have the body material, the tube material, and a transition region between that is formed from the former surface coatings. Thus, properties, such as heat capacity, heat transfer coefficients, Coefficient of thermal expansion, etc., are not uniform. Further, the interfaces between the different compositional regions provide different characteristics, such as for heat transfer and acoustic transmission. Taking only heat transfer as an example, heat transfer is not as efficient when passing from one medium to another, as compared to through a homogeneous medium, because of interfacial resistances between two metals.

Another difference is that with the tubeless article, the size of the open channel depends on the size of a core that can be removed. The smallest size will be the smallest diameter core that can be removed, and the largest will be the largest core that can be economically removed. With the tube-walled article, the size of the open channel depends on how small a hole can be made in a hollow elongated member, since it will not be pulled out.

Arrangement of Core Members

In general, there are different considerations regarding the location and arrangement of tubular core members that are retained. These considerations relate to fabrication issues, and application issues.

Fabrication Issues

Regarding fabrication issues, the articles can be fabricated using a fixture that is substantially identical to that shown in FIG. 4 for the solid core members. They can be provided in parallel rows and sheets, as shown with the solid core members in FIGS. 7, 8, 9, 9A, 10, 11. They can be close packed, or wide packed in the same manner as can be the solid cores. They can be provided in 0 degree or other angle lay-ups, in multiple layers. The considerations regarding minimum spacing between core members are somewhat different, because, since they are not pulled out, it is not as important to space the tubular members far enough away from each other to prevent shear tearing of the intervening matrix material, as is required when solid core members are pulled out. The location of the channels is not the location of the outer walls of the core members, but, rather, is the location of the hollow interior channels of the tubes. There is no need to avoid mechanical interlock between the core members and the matrix material, and, in fact, interlock is desired and beneficial.

The tubular core members can be bent and interwoven, and otherwise curved in any shape or relationship, without regard to difficulties that such curving would cause to core removal, since they are not to be removed. The only such consideration is that no excessive necking down, or kinking occurs, which would close off the internal channels.

An important characteristic of tube-walled articles is that they can be made of almost limitless aspect ratio. This is because the tube is not pulled out from the matrix. Thus, the designer is not limited by the need to overcome friction forces without rupturing the core. Small diameter tubes can be made to essentially any length, even thousands of feet, and as small in internal diameter as 0.002 in. (0.0051 cm) and even, for some materials, as small as 0.001 in (0.0025 cm). Thus, the aspect ratio of the channels of tube-walled articles can be enormous. The devices can be many feet long. Possible applications for such long, very high aspect ratio channeled articles include heat exchangers, chemical filters, structural components for aerospace applications, such a full length wing and fuselage parts.

Such very long tube-walled articles can be made using the same processes that have been discussed above, with additional precautions taken to maintain the geometrical integrity of the cores during core infiltration. For instance, a dissolvable stand (having lower melting temperature than the core infiltrant) can be placed every few inches, to prevent the core members from bending during core infiltration under pressure.

It is also possible to make such a channeled article thousands of feet long, on a continuous line. An array of hollow tubes are coated with appropriate coating layer or layers. They are pulled through an extrusion die along with molten metal. The molten metal wets the surface of the coated tubes and draws itself into the array. It solidifies, thereby resulting in a long array.

Application Issues

Regarding application issues, different applications will entail different considerations regarding the location of the tubular members. Several representative applications are considered below, as illustrative guidelines, and not as limiting discussions.

Heat Sinks

Channels articles using tube-walled channels can be used for semi-conductor related heat sinks, in much the same manner as discussed above, to provide excellent results, as compared to presently available (year 2002) technology. For instance, a tin matrix with embedded stainless steel tube walled channels obtained sustainable cooling of 65 w/cm$^2$, in a package that measures approximately 0.125 in$^3$ (2.05 cm$^3$) (which is less than 1% the size of a commercially available heat sink of comparable capacity. By comparison, a finned conventional package that has a 30 w/cm$^2$ capacity occupies nearly 54 in$^3$ (884 cm$^3$). The channels were 0.006 in. (0.015 cm) diameter, on 0.022 in. (0.056 cm) centers, with a tube wall thickness of 0.003 in. (0.0076 cm). This was done in the same manner as discussed above with tube-less channels, by flowing air pressurized to five atmospheres (75 psi) through the tubes. As the air enters, it speeds up according to Rayleigh flow parameters, and is able to flow much faster than typical air flow speeds on a conventional heat sink. Because of the large surface area and symmetric thermal conductance offered by the round microtubes, this high speed air is heated rapidly and cools the article.

The considerations that go into the size of the channels in the tube-walled, as compared to the tube-less articles have been discussed above. The spacing of the openings depends on different considerations. With tube-less articles, it depends on how close can be placed the removable cores, without tearing the remaining matrix material upon removal. With tube-walled articles, where tubes are not removed, it depends on how small can be made the hollow interior of elongated members, and how thin can their annular walls be made. The thinner are the walls, the closer can be spaced the channels. At present, the smallest conveniently available tubes have 0.002 in. (0.051 cm) diameter channels. It is believed that 0.001 in. (0.025 cm) diameter channels are, or will soon be available.

Tube-walled articles generally will not be as efficient for heat transfer as are tube-less articles, because there are heat transfer losses associated with the conduction and convection of heat through an interface between different media. In tube-walled articles, there is an interface between the matrix body, and the material of the tube, and also, perhaps another, through regions made up of constituents of the former coating layers, as well as one from the interior of the tube to the heat transfer fluid. With the tube-less article, there is only the interface between the inside wall and the heat transfer fluid.

Tube-walled articles also must contend with possible differences in the coefficient of thermal expansion ($C_{TE}$) throughout the body, because of the dual phase nature (matrix body material, on the one hand, and tubes, on the other hand), while a tube-less article is substantially homogeneous. When used as a heat sink, which experiences temperature cycles, it is necessary that the differences in expansion and contraction of the various components not set up intolerable stresses (either static, or cyclic) within the heat sink, which stresses might make it fail. It is also undesirable if the package bends. The heat sink loses contact, thus failing to dissipate heat.

Microactuators (Thermomechanically Compliant Structures)

Tube-walled channeled articles can be designed to produce novel bending characteristics, much like conventional carbon fiber composites. However, channeled articles have the added possibility of using tubular core members with coefficients of thermal expansion that are different from each other. Thus, novel bending can be produced internally by global temperature changes, either external or internal.

Figure 20A:
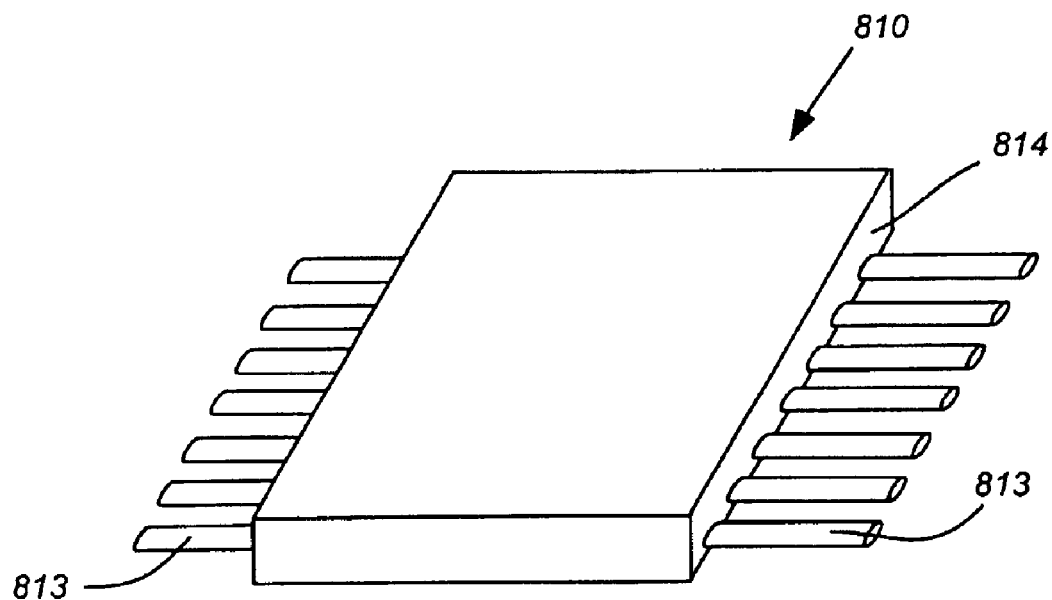
FIG. 20A shows, schematically, in a perspective view, a tube-walled channeled article used for a micro-actuator.
Figure 20B:
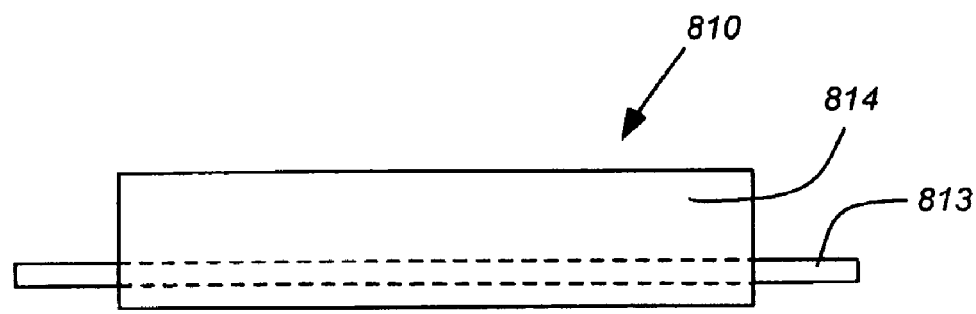
FIG. 20B shows, schematically, an elevation view of the channeled article of FIG. 20A.
Figure 20C:
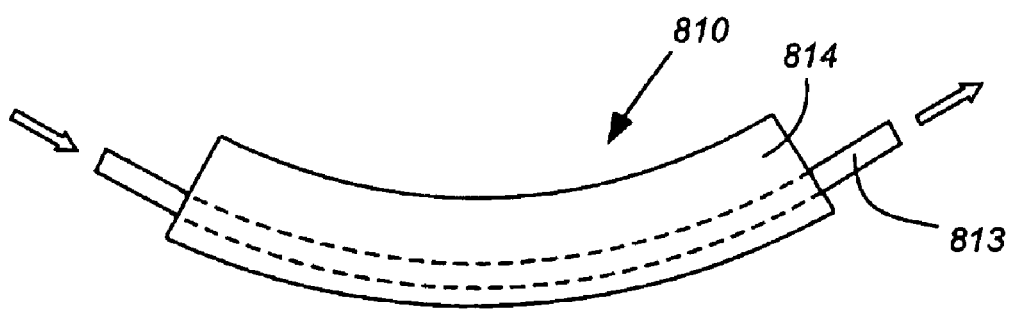
FIG. 20C shows, schematically, the channeled article shown in FIG. 20B, while controlled temperature fluid is flowed through the channels, causing the article to bend.

FIG. 20A shows schematically a channeled article 810 having a set of channels 813 therethrough. A controlled temperature fluid source (not shown) is coupled to the channels so as to provide fluid of a controlled temperature to them. The fluid passes through the channels, heating or cooling them, and the surrounding metal matrix. The matrix and the channels are composed of materials that have different coefficients of thermal expansion, so that they expand to different degrees. Thus, as shown in FIG. 20C, when fluid is flowed through the channels 813, the entire body curves, due to the mismatch in coefficients. (The principle is similar to that underlying a bi-metallic strip.) The direction and degree of curvature depends on many factors, including the differences in the coefficients. For instance, Invar® (Fe—Ni) tubes can be embedded in a steel article. Or, a steel article can have some Invar® tubes, and some steel tubes, or, any combination, of any number of different material tubes. (The Invar® tubes could be bound to the steel matrix with a nickel plating. In particular, an electroless nickel (nickel phosphorous braze alloy) would work very well as a bond. The temperature of the fluid that passes through the tubes can be very closely controlled by control devices (not shown), which are now conventional. In fact, different temperature fluids can be passed through different tubes, and through the same tube, at different times.

The bending of the device, and thus its conformation, is highly repeatable, due to the stable nature of the bending thermal properties of metals. It is also highly determinable, as the length of the materials is known to great precision, as well as their thermal properties. This is a repeatable compliance in the material, which can be controlled to micron scale precision.

Figure 21A:
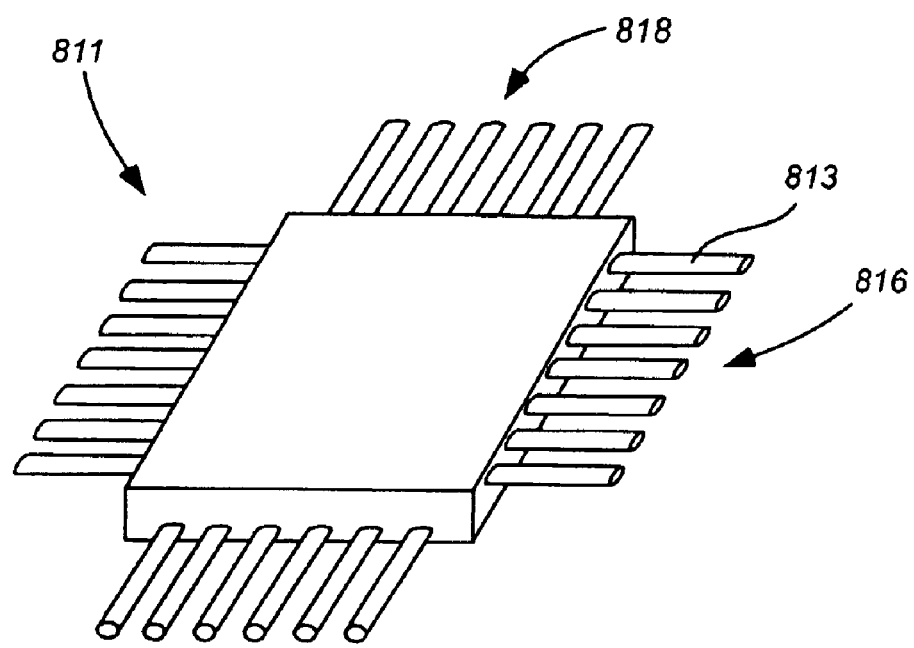
FIG. 21A is a schematic perspective view of a tube walled article having two sets of tubes symmetrically arrayed therethrough relative to a neutral axis, also used for a micro-actuator.
Figure 21B:
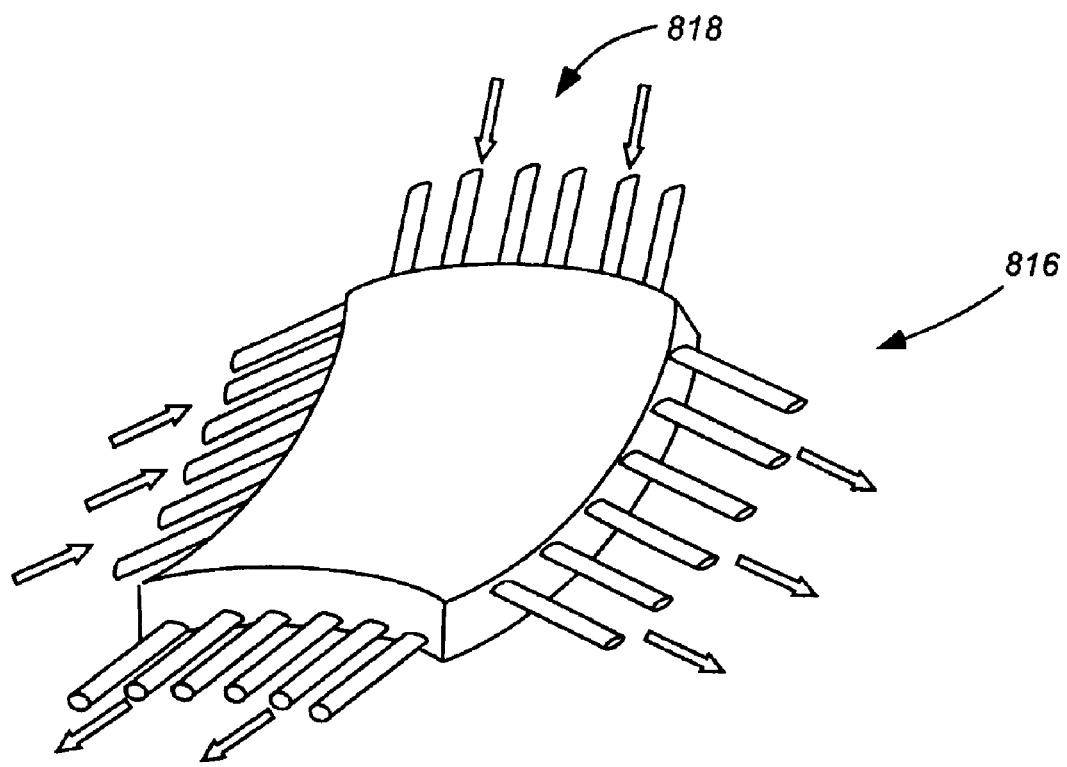
FIG. 21B is a schematic perspective view of the channeled article of FIG. 21A, with controlled temperature fluid flowing through both sets of tubes, causing it to assume a saddle shape.

FIG. 21A shows, schematically, a similar channeled article 811, having two sets of orthogonally placed channels, 816 and 818. These sets are located symmetrically with respect to the body's neutral axis (one set 816 above, and one set 818 below as shown in FIG. 21A). If heated fluid is passed through both sets of channels, and if there is a large enough difference between the coefficients of thermal expansion of the channels and the body matrix material, then the article will assume a saddle shape, as shown in FIG. 21B.

Figure 22A:
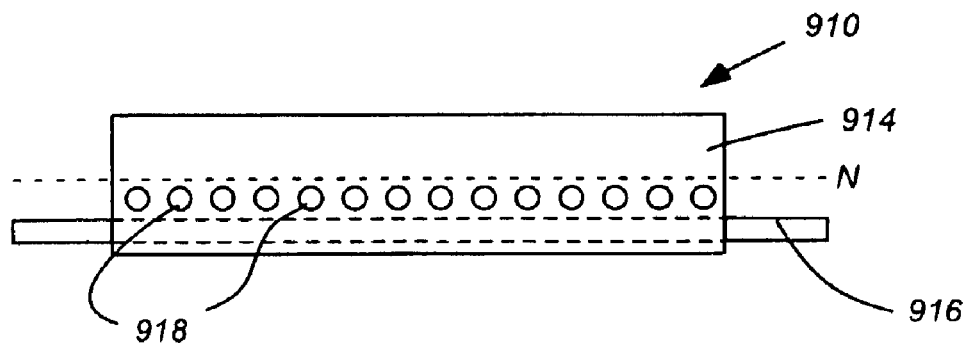
FIG. 22A is a schematic elevation view of a tube walled article similar to that shown in FIG. 21A, with the two sets of tubes arranged on the same side of a neutral axis.
Figure 22B:
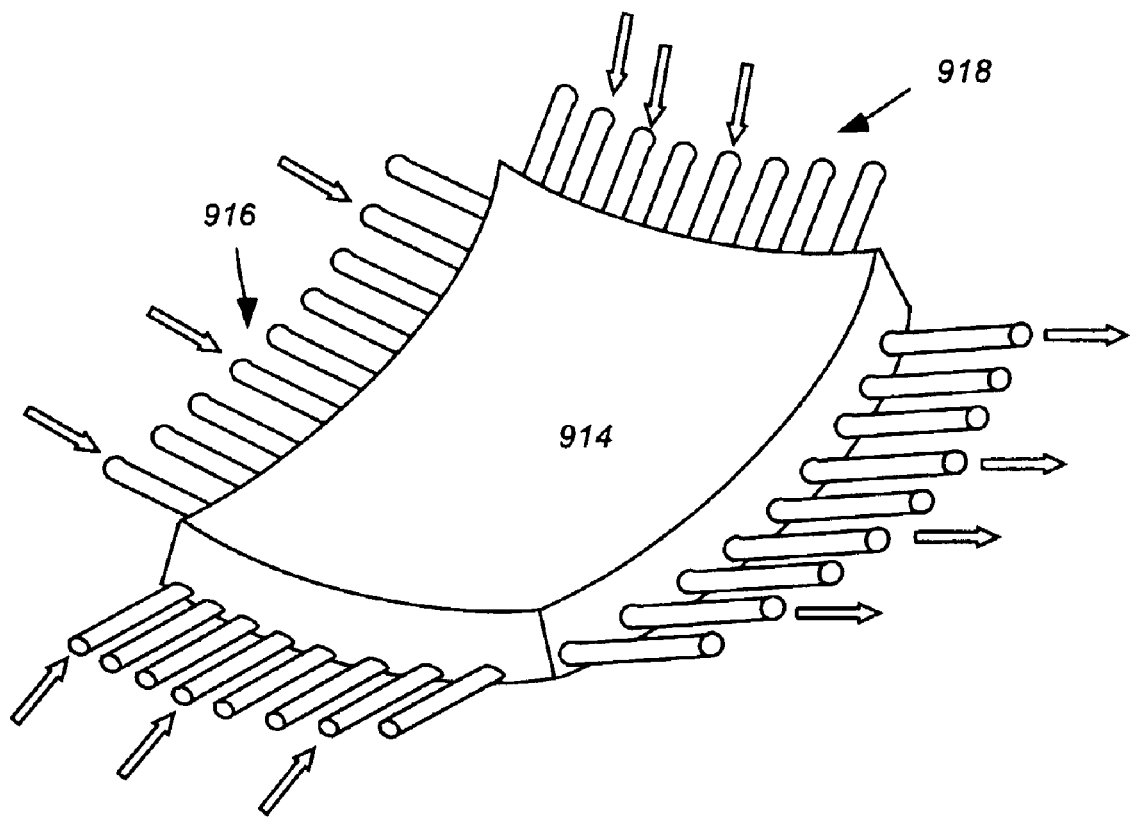
FIG. 22B is a schematic perspective view of the channeled article of FIG. 22A, with controlled temperature fluid flowing through both sets of tubes, causing it to assume a concave facing upward shape.

FIG. 22A shows, schematically, a similar channeled article 910, having two sets of orthogonally placed channels, 916 and 918. These are located asymmetrically with respect to the body's neutral axis N (both on the same side, below, as shown). If heated fluid is passed through both sets of channels, and if there is a large enough difference between the coefficients of thermal expansion of the channels and the body matrix material, then the article will assume a concave facing upward shape, as shown in FIG. 22B.

One application, by way of illustration only, and not intended to be limiting in any sense, is a thermo-mechanical focusing mechanism for active control of mirrors. Tube-walled channeled articles can offer localized sub-micron level surface control to optics using simple thermal control systems.

In general, thermal control systems which create localized, controlled temperature are already quite common. They can be used to inexpensively heat and cool small or large regions of a tube-walled channeled article, and induce mechanically compliant responses on the micron and sub-micron scale. This method is much more reliable and less expensive than traditional mechanical focusing and aiming mechanisms, such as with servo motors, linear motors, actuators, etc. It would also be lighter, and more compact.

Lightweight Anisotropic Structural Shaped Parts

Light weight, anisotropic structural shaped parts, as discussed above, in connection with tubeless channeled articles can also be constructed with tube-walled channeled articles, and similar considerations apply. An important additional feature of tube-walled articles, already mentioned above, and particularly noteworthy in connection with structural shaped parts, is that the aspect ratio of tube-walled articles is essentially limitless. Thus, support beams in the fuselage of an airplane could be made tens of feet long, with, for instance, 0.005 in. (0.013 cm) diameter channels, or even smaller, therethrough.

Lightweight Energy Absorbing Armor

Lightweight energy absorbing armor, as discussed above, in connection with tubeless channeled articles can also be constructed with tube-walled channeled articles, and essentially the same considerations apply.

Acoustic Films and Sheets

Acoustic films and sheets, as discussed above, in connection with tubeless channeled articles can also be constructed with tube-walled channeled articles, and essentially the same considerations apply.

Ranges of Parameters

The inventions disclosed herein include methods of making channeled articles, the articles themselves, and methods of using the articles, as well as assemblies that incorporate such articles. The designer will understand that these inventions constitute new ways of making channeled articles, and, particularly new ways of making such channeled articles with very small diameter or perimeter openings, and also, related, but different, with very large aspect ratios of length to opening size (diameter or perimeter, as appropriate). Known techniques for making such articles include machining, such as drilling and honing, and EDM (electro discharge machining) techniques. These have their limitations, particularly in their ability to make very small diameter openings, and openings with large aspect ratios. The literature reports a channeled article showing about twenty parallel, straight channels about 1.13 in. (2.86 cm) long and having an inner diameter of approximately 0.02 in. (0.05 cm), for an aspect ratio of about 57:1. The report does not state how these were fabricated, other than to refer to special manufacturing technology. Further, the known techniques are limited in their ability to provide pluralities of such channels, in controlled spatial relationship to each other. The present inventions provide new flexibility in all these respects.

Regarding the lower limits of diameter (or, if a more complex shape, perimeter) provided by these related inventions, several considerations apply, most of which have been discussed above, but which are conveniently understood in relation to each other. Tubeless channeled articles can be made with very small diameter cores. Polymer filaments, of approximately 0.00017 in. (0.00043 cm) in diameter, can be burned out from a sintered ceramic matrix body, to leave an open channel of that size. The body can be sintered, during which process it shrinks, such that the channel may have a diameter of as small as about 0.0001 in. (0.00025 cm). If the designer desires openings through a ceramic body of this small size, then this technique will achieve it. It can also be used with larger filaments, to produce larger diameter channels of any size desired, up to the limit at which point it might be more economical to make the article using traditional ceramic processing techniques. The aspect ratio of such small diameter holes can be very high, with the upper limit depending on the considerations of how small the diameter can be made, as well as how long a core can be maintained in a fixture. Longer cores require additional fixture elements or processing steps to keep them from deforming during processing. However, very long filaments can be produced, and maintained. Thus, the upper limit of aspect ratio for this technique is very high.

Turning next to the techniques discussed above in which a core is pulled out from the formed matrix material, the cores can be ceramic, metal, or high temperature polymers. It is believed that the smallest diameter channel can be achieved using carbon fibers, which can be made to be very thin, and with very high tensile strength. Carbon fiber having a diameter as small as 0.000075 in. (0.00019 cm) can be made and pulled from a formed matrix. Representative carbon fibers have a tensile strength of about 500,000 psi (3.5 GPa) with an upper limit near to a million psi (7 GPa). If the designer does not require channels of such small diameter (which is likely for most applications) then, naturally, the designer will choose larger diameter carbon fiber for the core. The maximum aspect ratio depends on the maximum length carbon core member that can be maintained in a fixture, and pulled out. Regarding pulling out, the frictional forces increase with the length, and thus, longer core members require more force to remove. Thus, at some length, the force required may be larger than the tensile strength that a carbon core member of the chosen diameter has. Thus, the maximum aspect ratio depends on the frictional environment in which the core resides. This will depend on its surface treatment, the type of core, and, if present, any core release coating. Needless to say, with such small diameter cores having such high tensile strengths, very large aspect ratios can be obtained with carbon fiber cores.

Very small opening channels can also be achieved using the tubeless techniques and high strength metal wires, such as such as molybdenum, or tungsten or a high performance stainless steel. As is discussed above, these metal wires can be drawn to a tensile strength of approximately 350,000 psi (2.4 GPa). Assuming that the force required to remove a one inch long wire is on the order of 20 lbs. (100N), wire of as small as 0.001 in. (0.0025 cm) could be removed, to provide channels of that diameter, with an aspect ratio of approximately 1000:1. If the designer does not require such a small diameter opening, then, larger diameter wire can be used. Or, if the article has larger dimensions, then longer, thicker wire can be used. Thus, the aspect ratio of 1000:1 is an approximate upper limit of what is now possible with metal wire cores, but smaller aspect ratio channels can also advantageously be made using these techniques. It is estimated that the economics of production will make it relatively impractical to use these techniques for holes larger than 0.125 in. diameter, which can be made using conventional techniques. The designer will chose a metal that has enough strength for the aspect ratio desired, and which can also satisfy the requirements of non-wetting, non-miscible, potential for core release coating, discussed above. Typically, if great strength is not required, then less expensive, less specialized metals may be used. However, for very long channels of that diameter, it may be more economical to use the presently disclosed techniques.

Turning next to the spacing between channels, and, thus, the aspect ratio of the solid matrix portions left behind after the core members are removed, the general considerations relate to the shear strength of the matrix material, and the shear stresses that will arise due to pulling out the cores, as discussed above. In general, the thinner the solid portion (space between channels), the more fragile they will be. Thus, the forces must be kept below the maximum shear stress of the material. Additional constraint is also due to the difficulty of pressing matrix material into very small spaces between the core members. However, there is really no upper limit to the thickness of such spaces. They can be as large as the designer chooses. Thus, the range of desirability of using the present invention regarding larger spaces between channels depends on the economics of using the disclosed techniques, and competing techniques, but does not relate to technical difficulties of the disclosed inventions.

Tube-walled channeled articles present different considerations as to the ranges of practical use. The cores are not removed. The diameter of the open channel can typically be as small as the smallest channel that can be provided. Presently, this is about 0.002 in. (0.0051 cm) and may be near to 0.001 in. (0.00254 cm). Thus, the designer may choose tubes having any opening size (inner diameter) of larger than this lower limit, again, up to whatever size becomes impractical economically in competition with other techniques. The length of such tubes, and thus the size of such articles, and the upper limit of their aspect ratios, is, however, essentially unlimited, as described above. This is because such tube-walled channeled articles can be made with very long components, or, even, in a continuous process. Even using a tube that is a relatively short 100 in. long (254 cm), the aspect ratio of an article having modestly sized, 0.005 in. (0.013 cm), channel diameter is 20,000:1. Thus, the designer has an enormous range of aspect ratios from which to choose.

Smaller diameter channels are typically more difficult to handle, as are longer channels. However, within the parameters discussed, using the techniques discussed, the designer has a wide range of possible channel diameters, and aspect ratios available from which to choose.

Considerations of channel spacing with tube-walled articles depend on the wall thickness of the tubes, and the minimum spacing through which matrix forming material can be forced, or provided. Thinner wall tubes require more care in handling than do thicker wall tubes. Typically, at a tube spacing of less than 0.004 in. (0.01 cm), packing sintering material becomes very challenging.

The present inventors therefore consider, as their inventions, any method to make a channeled article, and articles and assemblies made according to the disclosed techniques, with channel diameters as small as disclosed or as can be made with the disclosed techniquies, and as large as is economically practical. Similarly, the inventors consider their invention to include any such articles, methods and assemblies, that have aspect ratios of the open channels as large as disclosed, and as can be made with the disclosed techniques, or as small as is economically practical. Likewise, the inventors consider their invention to include any such articles, methods and assemblies, that have aspect ratios of the spaces between the open channels as large as disclosed, and as can be made with the disclosed techniques, or as small as is economically practical. Moreover, the inventors consider their invention to include any such articles, methods and assemblies, that have sizes of spaces between the open channels as small as disclosed, and as can be made with the disclosed techniques, or as large as is economically practical.

Partial Summary

Thus, this document discloses many related inventions.

One invention disclosed herein is method for fabricating an article having passages therethrough. The method comprising the steps of providing a fixture that defines a cavity, and providing a plurality of elongated, core members. The core members are arranged in the cavity in a pattern having each of the core members spaced away from any other core member. Matrix forming material is introduced into the cavity, and into spaces between and surrounding the core members. The fixture is maintained under conditions in which the matrix forming material substantially fills all of the spaces between and surrounding the core members and the cavity, such that the core members are substantially fully surrounded by matrix forming material. The fixture is maintained under conditions such that the matrix forming material becomes a unitary body surrounding the core members. The unitary body and surrounded core members are removed from the fixture. The core members are pulled out from the unitary body, the core members having been coated with a core release coating before the step of introducing matrix forming material, the core release coating having been selected to prevent bonding of the unitary body formed from matrix forming material to the core members, whereby a channel remains where each of the removed core members had been arranged. Such a method is identified herein generally as a method of producing a tubeless channeled article. The fixture may be clamped or otherwise secured.

Each of the core members typically has an extrudable cross-section along substantially all of its length, particularly that portion within the fixture. The core members can have a range of aspect rations, from 25:1 up to even 1000:1, depending on the strength of the materials, the frictional force required to remove the core, and the desired use. The core members may be solid metal wires, hollow metal tubes, ceramic fibers, such as carbon, or high temperature resistant polymeric fibers. The core members may have diameters of between about 0.0005 in. (0.0013 cm) and about 0.125 in. (0.318 cm), typically smaller than 0.02 in. (0.051 cm). The core members may have their centers spaced from each other less than 0.04 in. (0.1 cm), more typically less than 0.02 in. (0.051 cm) and even as close as less than 0.01 in. (0.025 cm).

Various methods can be used to introduce matrix forming material to the fixture, including liquid state methods such as die casting and core infiltration under positive or vacuum pressure, between and around the core members.

A solid state method that can be used to introduce matrix forming material is to provide powdered material into the cavity, substantially surrounding the core members, and then sintering the powdered material. The sintered powder can be metal or ceramic.

A hybrid solid/liquid state method that can be used to introduce matrix forming material is to provide powdered material into the cavity, substantially surrounding the core members, and then using liquid infiltration diffusion bonding sintering of the powdered material.

The core release coating generally is selected to prevent the matrix forming material from adhering to the core members, before, during and after any high temperatures and any corrosive environments resulting during the steps of introducing matrix forming material and maintaining the fixture. It is also selected to prevent the matrix forming material from eroding, corroding or dissolving the core members. One representative example is the core base material comprising nickel, the matrix forming material comprising tin, and the core release coating comprising boron nitride. It is frequently beneficial if the core release coating is not wetted by the matrix forming material. Alternately stated, the core release material and the matrix forming material typically are a pair selected such that a contact angle therebetween is greater than thirty degrees.

For instance, the core member can be an anodized base material, with the coating comprising an integral oxide coating of the base material, such as anodized aluminum, or titanium. Numerous other representative examples of combinations of core base material, matrix forming material and core release coating are discussed.

Many different methods of arranging the core members are disclosed, including in a substantially planar pattern, with all aligned in a 0 degree set up, and also multi-planar set ups, with core members in each plane either also being in a 0 degree set up, or at some other angle between + and −90°. The core members can be regularly or irregularly spaced, skewed, non parallel, angled relative to each other and the overall article geometry, etc. They can be close packed (hexagonal) or equi-packed, rectilinear.

The core members can all be straight, or arcuately curved. If curved, then the members have a tensile strength, and a curve that is gentle enough so that the sum of any mechanical interlock force and frictional force between the core member and the unitary body that arise during pulling out of the core member is less than the tensile strength of the core member. The core members can even curve around each other gently, if this requirement is met.

In general, the unitary body has a maximum sustainable shear stress. The core members are arranged far enough from each other so that when the core members are pulled from the unitary body, shear stresses that arise in the unitary body remain less than the maximum shear stress.

In addition to the inventive methods of forming a channeled article just discussed, channeled articles formed according to any of these methods are also considered to be inventions and are disclosed herein as such.

Another, related invention takes note of the fact that cores can be removed by burning them out, rather than pulling them out. More specifically, such an invention is a method for fabricating an article having passages therethrough. The method comprises the steps of providing a fixture that defines a cavity and providing a plurality of elongated, polymeric core members. The polymeric core members are arranged in the cavity in a pattern having each of the core members spaced away from any other core member. Ceramic matrix forming material is introduced into the cavity, and into spaces between and surrounding the core members. The fixture is maintained under conditions in which the matrix forming material substantially fills all of the spaces between and surrounding the core members and the cavity, such that the core members are substantially fully surrounded by matrix forming material. A low temperature adhesive is provided, typically before the powder is introduced into the fixture, to loosely bind the ceramic matrix forming material into a green intermediate part. The fixture is maintained under conditions such that the low temperature adhesive and the polymeric core members are burned away, and the ceramic matrix forming material sinters and becomes a unitary body surrounding open channels where the core members had formerly been located. The core members were located so as to provide open channels through the unitary body, from an input end to an output end.

According to some variations of this technique, the low temperature adhesive is polyvinyl alcohol. The core members can be very very small, having a diameter of between about 0.00017 in. (0.00043 cm) and about 0.125 in. (0.32 cm). It is beneficial in some cases to maintain the fixture under pressure and temperature conditions such that the matrix forming material shrinks between about 30% and about 50% by volume, resulting in correspondingly reduced diameter channels therethrough.

Still another related tubeless channeled article is formed according to similar steps as outlined above, except that there is no core release coating apart from the core member itself. Rather, the core member and the matrix forming material are selected such that they do not bond, or cause any problems of core dissolution, erosion or corrosion. Typically, if the matrix material is liquid at any time, then it does not wet the core member material. Similarly, they are not miscible. One suitable example of this method is to use a carbon fiber core member and matrix forming material from just about any metal. Or, conversely, most metals can be used for the core member, if the matrix forming material is a ceramic.

A somewhat different invention disclosed herein is a method of making a tube-walled channeled article. That invention is a method for fabricating an article having channels therethrough. The method comprises the steps of providing a fixture that defines a cavity and providing a plurality of elongated, hollow core members, comprising an elongated solid annulus of a core base material surrounding an elongated open channel. The core members are arranged in the cavity in a pattern having each of the core members spaced from any other core member. Matrix forming material is introduced into the cavity, and into spaces between and surrounding the core members. The fixture is maintained under conditions in which the matrix forming material substantially fills all of the spaces between and surrounding the core members and the cavity, such that the core members are substantially fully surrounded by matrix forming material. The fixture is maintained under conditions such that the matrix forming material becomes a unitary body surrounding and bonded to the hollow core members. The unitary body and surrounded hollow core members are removed from the fixture. The hollow core members are not removed from the surrounding unitary body. Their hollow regions constitute the channels of the channeled article. Thus, they are called tube-walled channeled articles.

As with the tube-less methods, the cores can be clamped in the fixture. The tubes can be metal. The open channels may have an aspect ratio from rather small, such as 25:1, to very large, even greater than 1000:1 for relatively small items, and even larger, if the item is made from a continuous process. The core members may comprise tubes having annular circular cross-sections, and having an outer dimension that is a diameter of between about 0.005 in. (0.013 cm) and about 0.02 in. (0.051 cm) with inner dimension of as small as 0.002 in or 0.001 in. A typical spacing between centers may be less than 0.03 in. (0.0762 cm)and, perhaps, even less than 0.01 in. (0.025 cm).

Other materials may also be used for the elongated members. They may comprise fibers of ceramic material having a high-temperature resistance or fibers of polymer material having a high-melting temperature.

The matrix forming material can be introduced around the core members in much the same ways as discussed above, including liquid state methods, such as die casting, with positive or vacuum pressure, solid state methods, such as sintering (either metal or powder particles) and hybrid liquid/solid state techniques, such as liquid infiltration diffusion bonding.

For most applications of tube-walled methods, a core retention coating is provided around the cores. The core retention coating is selected to insure that the solidified matrix material adheres to the core material, despite any high temperatures and any corrosive environments resulting during the steps of introducing matrix material and maintaining the fixture.

According to one invention, if a liquid matrix forming material is provided to the fixture, the core retention coating comprises at least one material that is wetted by at least one of any surrounding coating layers and the liquid metal. The core retention coating may comprise a multiple layer coating, comprising an inner layer and an outer layer. In such a case, the inner layer typically comprises a material that is selected to dissolve any oxides on the core base material and which is capable of bonding firmly to the outer coating layer during the step of maintaining the fixture. The outer coating layer comprises an alloy that is similar to the matrix material.

The coating layer may beneficially be, diffusible into the core base material and the matrix material, during the step of maintaining the fixture. The fixture is maintained under conditions such that the coating layer diffuses into the core base material and the matrix material.

Many different inventions of combinations of core material, matrix material, and one or multi-layer coating material are disclosed, as well as guidelines for selecting other suitable combinations from lists of candidate materials provided.

Tube walled channeled articles are also disclosed with the similar geometrical flexibility in the layup of tubes and channels. There is added flexibility, because the tubes need not be pulled out, and thus, to some extent, more severe bending can be tolerated. Furthermore, since they are not pulled out, they can be extremely long, even continuous, because there is no need to overcome retention forces without tearing a core that is being removed.

In addition to the inventions that constitute methods of forming tube-walled channeled articles, such channeled articles are also disclosed as inventions.

For instance, an invention disclosed herein is a channeled article, comprising a body portion, having a plurality of channels therethrough, the body portion comprising a primary body composition. Surrounding each of the channels, is a vestigial tube portion, having an inner dimension, defined by the channel. The tube portion comprises a primary tube material composition. Surrounding each of the tube portions, is an interface between two regions of different material composition, at least one of which being the body portion.

Other inventions disclosed herein are assemblies of such channeled articles. For instance, a tube walled channeled article, as just described, can be used as a temperature controlled actuator. The body portion composition of such an article comprises a metal composition having a first coefficient of thermal expansion and the plurality of tube portions having a composition comprising a second metal composition having a second coefficient of thermal expansion, different from the first. The body portion has a geometry and the channels are arranged relative to the geometry such that when heat transfer fluid of a temperature other than ambient is flowed through the channels, the geometry of the channeled article changes from a rest geometry, due to a difference between the first and second coefficients of thermal expansion. Thus, by passing controlled temperature fluid through the channels, the conformation of the article can be changed. It can thus be used to actuate mechanical systems, for instance, mirrors on a telescope.

An invention is disclosed that also includes such an article, along with a heat transfer fluid supply, and coupling apparatus for coupling the fluid supply to the channels, such that heat transfer fluid can flow from the fluid supply to the channeled article. The device may also include a heat transfer fluid temperature control module configured to control the temperature of the heat transfer fluid to a specified temperature, as it is supplied to the channeled article.

Yet another inventive aspect of the inventions disclosed herein is such a channeled article configured as a heat sink for a semiconductor device. It has a body portion, having a plurality of channels therethrough. The body portion comprises a primary body composition. Each of the channels have a diameter smaller than about 0.02 in. (0.05 cm) and an input end and an output end. An input manifold hydraulically couples each of the plurality of channels at the input end to a single manifold input. Thus, the channeled article is coupled to the semiconductor device, and heat is transferred from the device to the channeled article.

Additional inventions related to this also comprise a thermally conductive couple that couples the channeled article to a semiconductor device, in a heat communicating relationship, such that heat conducts away from the semiconductor device to the channeled article from which it is disposed. An output manifold is also typically supplied, as is a compressor to compress heat transfer fluid and to pass it through the channeled article. The output manifold is vented to atmosphere, or lower pressure, such that the heat transfer fluid flows therethrough at a very high speed, thus, carrying away a large amount of heat.

According to some embodiments disclosed herein, the channeled article is adhered to a semiconductor device with a metallurgical bond. Or, it may be formed integrally therewith. Or, a heat spreader may be interposed between the semiconductor device and the channeled article heat sink.

The channeled article may be either a tubeless channeled article, or a tube-walled channeled article.

Yet another related group of inventions disclosed herein exploits the channeled article as a structural element. Either tube-walled or tubeless may be used. Such an article is for use in an environment that will subject the component to an expected pattern of load. The structural component comprises an exterior surface and an internal body region. The internal body region comprises a solid body matrix having portions with a relatively long dimension and a substantially perpendicular relatively thin dimension. It also has a plurality of spaced apart open channels, arranged with portions thereof generally congruent with adjacent channels, with one of the solid relatively long, relatively thin body portions therebetween. The channels and the solid body portions are mutually arranged so that, in use, a major portion of the expected load is applied to the solid body portions along the relatively long dimension, and only relatively minimal portion of the expected load is applied to the solid body portions along the relatively thin dimension. The body portion can be metal or ceramic. The body may have different regions of roughly congruent channels, which channels are not congruent or parallel to similar channels in other regions.

Many techniques and aspects of the inventions have been described herein. The person skilled in the art will understand that many of these techniques can be used with other disclosed techniques, even if they have not been specifically described in use together.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

What is claimed is:

1. A method for fabricating an article having passages therethrough, the method comprising the steps of:
   a. providing a fixture that defines a cavity;
   b. providing a plurality of elongated, core members;
   c. arranging said core members in said cavity in a pattern having each of said core members spaced away from any other core member;
   d. introducing matrix forming material into said cavity, and into spaces between and surrounding said core members, said core members having been coated with a core release coating before said step of introducing matrix material, said coating comprising an inner layer that is adjacent said core member and an outer layer that surrounds said inner layer, said matrix forming material being a material that wets said outer coating layer material;
   e. maintaining said fixture containing said matrix forming material and said core members, under conditions in which said matrix forming material substantially fills all of said spaces between and surrounding said core members and said cavity, such that said core members are substantially fully surrounded by matrix forming material;
   f. maintaining said fixture under conditions such that said matrix forming material becomes a unitary body surrounding said core members;
   g. removing said unitary body and surrounded core members from said fixture; and
   h. pulling said core members out from said unitary body, said coating inner layer having been selected to prevent bonding of said unitary body formed from matrix forming material to said core members, by being non-wetting with respect to at least one of the outer coating layer and an outer surface of the core members, whereby a channel remains where each of said removed core members had been arranged.

2. The method of claim 1, said step of arranging comprising clamping said core members securely in said fixture.

3. The method of claim 2, said step of introducing matrix forming material into said cavity comprising the step of die casting said matrix forming material around said core members.

4. The method of claim 2, said step of introducing matrix forming material into said cavity comprising the step of core infiltrating said matrix forming material under positive pressure, between and around said core members.

5. The method of claim 2, said step of introducing matrix forming material into said cavity comprising the step of core infiltrating said matrix forming material between and around said core members, with vacuum assistance.

6. The method of claim 2, said step of introducing matrix forming material into said cavity comprising the step of providing powdered material into said cavity, substantially surrounding said core members, and said step of maintaining said fixture comprising the step of sintering said powdered material.

7. The method of claim 6, said powder comprising metal.

8. The method of claim 7, said powder comprising a coated base powder, and said step of sintering comprising the steps of conducting liquid infiltration diffusion bonding sintering.

9. The method of claim 6, said powder comprising a ceramic.

10. The method of claim 1, each of said core members having an extrudable cross-section along substantially all of its length.

11. The method of claim 1, said core members having an aspect ratio of greater than 50 to 1.

12. The method of claim 1, said core members having an aspect ratio of greater than 100 to 1.

13. The method of claim 1, said core members having an aspect ratio of greater than 1000 to 1.

14. The method of claim 1, said core members comprising solid metal wires.

15. The method of claim 1, said core members comprising hollow metal tubes.

16. The method of claim 1, said core members comprising ceramic fibers.

17. The method of claim 1, said core members comprising carbon fibers.

18. The method of claim 1, said core members having a diameter of between about 0.0005 in. (0.0013 cm) and about 0.125 in. (0.318 cm).

19. The method of claim 18, said core members having a diameter of between about 0.0005 in. (0.00127 cm) and 0.02 in. (0.051 cm).

20. The method of claim 1, said core members having their centers spaced from each other less than 0.04 in. (0.1 cm).

21. The method of claim 1, said core members having their centers spaced from each other less than 0.02 in. (0.051 cm).

22. The method of claim 1, said core members having their centers spaced from each other less than 0.01 in. (0.025 cm).

23. The method of claim 1, said core members comprising fibers of ceramic material having a high melting temperature.

24. The method of claim 1, said core members comprising polymer material having a relatively high melting-temperature for a polymer.

25. The method of claim 1, said core release coating comprising a coating that is selected to prevent said matrix forming material from adhering to said core members, before, during and after any high temperatures and any corrosive environments resulting during said steps of introducing matrix forming material and maintaining said fixture.

26. The method of claim 1, said core release coating comprising a coating that is selected to prevent said matrix forming material from eroding said core members, before, during and after any high temperatures resulting during said steps of introducing matrix forming material and maintaining said fixture.

27. The method of claim 1, said core release coating comprising a coating that is selected to prevent said matrix forming material from corroding said core members, before, during and after any high temperatures resulting during said steps of introducing matrix forming material and maintaining said fixture.

28. The method of claim 1, said core release coating comprising a material that is not wetted by said matrix forming material.

29. The method of claim 1, said core release material and said matrix forming material comprising a pair selected such that a contact angle therebetween is greater than thirty degrees.

30. The method of claim 1, said step of arranging said core members in a pattern comprising arranging said core members in a substantially planar pattern, with all of said core members substantially parallel to each other, in a 0 degree direction, whereby a pattern of channels results with all of said channels substantially coplanar and parallel to each other, in a 0 degree direction.

31. The method of claim 1, said step of arranging said core members in a pattern comprising arranging said core members in a pattern that occupies more than one plane, with all of said core members substantially parallel to each other, in a 0 degree direction, whereby a pattern of channels results with all of said channels substantially parallel to each other, in a 0 degree direction, in more than one plane.

32. The method of claim 31, said pattern occupying a plurality of planes, with said core members and resulting channels arranged in a close hexagonal packed pattern.

33. The method of claim 31, said pattern occupying a plurality of planes, with said core members and resulting channels arranged in a wide packed pattern, having their centers forming nodes of a rectilinear network.

34. A method for fabricating an article having passages therethrough, the method comprising the steps of:
   a. providing a fixture that defines a cavity;
   b. providing a plurality of elongated, core members;
   c. clamping said core members securely to said fixture, thereby arranging said core members in said cavity in a pattern having each of said core members spaced away from any other core member, comprising arranging:
      i. first set of core members in a first substantially planar pattern, with all of said core members substantially parallel to each other, in a 0 degree direction;
      ii. a second set of core members in a second substantially planar pattern, with all of said core members substantially parallel to each other, in a direction of between about +90 degrees and about −90 degrees;
   d. providing powdered metal matrix forming material into said cavity, and into spaces between and substantially surrounding said core members;
   e. maintaining said fixture containing said matrix forming material and said core members, under conditions in which said matrix forming material substantially fills all of said spaces between and surrounding said core members and said cavity, such that said core members are substantially fully surrounded by matrix forming material;
   f. maintaining said fixture under conditions such that said powdered matrix forming material experiences liquid infiltration diffusion bonding sintering and becomes a unitary body surrounding said core members;
   g. removing said unitary body and surrounded core members from said fixture; and
   h. pulling said core members out from said unitary body, said core members having been coated with a core release coating before said step of introducing matrix forming material, said core release coating having been selected to prevent bonding of said unitary body formed from matrix forming material to said core members, whereby a channel remains where each of said removed core members had been arranged;
   whereby a pattern of channels results with a first set of channels in a first substantially planar pattern, with all of said first set of channels in a 0 degree direction, and a second set of channels in a second, substantially planar pattern, in a direction of between about +90 degrees and about −90 degrees.

35. The method of claim 34, said second set of core members, and thus, said second set of channels, arranged in a 90 degree direction.

36. A method for fabricating an article having passages therethrough, the method comprising the steps of:
   a. providing a fixture that defines a cavity;
   b. providing a plurality of elongated, core members said core member comprising an anodized base material;
   c. arranging said core members in said cavity in a pattern having each of said core members spaced away from any other core member;
   d. introducing matrix forming material into said cavity, and into spaces between and surrounding said core members;
   e. maintaining said fixture containing said matrix forming material and said core members, under conditions in which said matrix forming material substantially fills all of said spaces between and surrounding said core members and said cavity, such that said core members are substantially fully surrounded by matrix forming material;
   f. maintaining said fixture under conditions such that said matrix forming material becomes a unitary body surrounding said core members;
   g. removing said unitary body and surrounded core members from said fixture; and
   h. pulling said core members out from said unitary body, said core members having been coated with a core release coating before said step of introducing matrix forming material, said coating comprising an integral oxide coating of said base material, having been selected to prevent bonding of said unitary body formed from matrix forming material to said core members, whereby a channel remains where each of said removed core members had been arranged.

37. The method of claim 36, said core member comprising anodized aluminum.

38. The method of claim 36, said core member comprising anodized titanium.

39. A method for fabricating an article having passages therethrough, the method comprising the steps of:
   a. providing a fixture that defines a cavity;
   b. providing a plurality of elongated, core members said core member comprising nickel;
   c. arranging said core members in said cavity in a pattern having each of said core members spaced away from any other core member;
   d. introducing matrix forming material into said cavity, and into spaces between and surrounding said core members, said matrix forming material comprising tin;
   e. maintaining said fixture containing said matrix forming material and said core members, under conditions in which said matrix forming material substantially fills all of said spaces between and surrounding said core members and said cavity, such that said core members are substantially fully surrounded by matrix forming material;
   f. maintaining said fixture under conditions such that said matrix forming material becomes a unitary body surrounding said core members;
   g. removing said unitary body and surrounded core members from said fixture; and
   h. pulling said core members out from said unitary body, said core members having been coated with a core release coating before said step of introducing matrix forming material, said core release coating comprising boron nitride, having been selected to prevent bonding of said unitary body formed from matrix forming material to said core members, whereby a channel remains where each of said removed core members had been arranged.

40. The method of claim 1, said unitary body having a maximum sustainable shear stress, said step of arranging having comprised spacing said core members far enough from each other so that when said core members are pulled from said unitary body, shear stresses that arise in said unitary body remain less than said maximum shear stress.

41. A method for fabricating an article having passages therethrough, the method comprising the steps of:
   a. providing a fixture that defines a cavity;
   b. providing a plurality of elongated, arcuately curved core members;
   c. arranging said core members in said cavity in a pattern having each of said core members spaced away from any other core member;
   d. introducing matrix forming material into said cavity, and into spaces between and surrounding said core members;
   e. maintaining said fixture containing said matrix forming material and said core members, under conditions in which said matrix forming material substantially fills all of said spaces between and surrounding said core members and said cavity, such that said core members are substantially fully surrounded by matrix forming material;
   f. maintaining said fixture under conditions such that said matrix forming material becomes a unitary body surrounding said core members;
   g. removing said unitary body and surrounded core members from said fixture; and
   h. pulling said core members out from said unitary body, said core members having been coated with a core release coating before said step of introducing matrix forming material, said core release coating having been selected to prevent bonding of said unitary body formed from matrix forming material to said core members, and each said curved core member having a tensile strength, and a curve that is gentle enough so that the sum of any mechanical interlock force and frictional force between said core member and said unitary body that arise during pulling out of said core member is less than the tensile strength of said core member, whereby a channel remains where each of said removed core members had been arranged.

42. A method for fabricating an article having passages therethrough, the method comprising the steps of:
   a. providing a fixture that defines a cavity;
   b. providing a plurality of elongated, core members;
   c. arranging said core members in said cavity in a pattern having each of said core members spaced away from any other core member in a substantially planar pattern with at least two of said core members arranged non-parallel to each other;
   d. introducing matrix forming material into said cavity, and into spaces between and surrounding said core members;
   e. maintaining said fixture containing said matrix forming material and said core members, under conditions in which said matrix forming material substantially fills all of said spaces between and surrounding said core members and said cavity, such that said core members are substantially fully surrounded by matrix forming material;

f. maintaining said fixture under conditions such that said matrix forming material becomes a unitary body surrounding said core members;

g. removing said unitary body and surrounded core members from said fixture; and h. pulling said core members out from said unitary body, said core members having been coated with a core release coating before said step of introducing matrix forming material, said core release coating having been selected to prevent bonding of said unitary body formed from matrix forming material to said core members, whereby a channel remains where each of said removed core members had been arranged.

43. A method for fabricating an article having passages therethrough, the method comprising the steps of:

a. providing a fixture that defines a cavity;

b. providing a plurality of elongated, core members;

c. arranging said core members in said cavity in a pattern having each of said core members spaced away from any other core member with at least two of said core members being non-parallel to each other, and, with at least two of said core members being non-coplanar with each other;

d. introducing matrix forming material into said cavity, and into spaces between and surrounding said core members;

e. maintaining said fixture containing said matrix forming material and said core members, under conditions in which said matrix forming material substantially fills all of said spaces between and surrounding said core members and said cavity, such that said core members are substantially fully surrounded by matrix forming material;

f. maintaining said fixture under conditions such that said matrix forming material becomes a unitary body surrounding said core members;

g. removing said unitary body and surrounded core members from said fixture; and h. pulling said core members out from said unitary body, said core members having been coated with a core release coating before said step of introducing matrix forming material, said core release coating having been selected to prevent bonding of said unitary body formed from matrix forming material to said core members, whereby a channel remains where each of said removed core members had been arranged, whereby a pattern of channels results with at least two of said channels being non-parallel, and at least two of said channels being non-co-planar.

44. A method for fabricating an article having passages therethrough, the method comprising the steps of:

a. providing a fixture that defines a cavity;

b. providing a plurality of elongated, stainless steel core members;

c. arranging said core members in said cavity in a pattern having each of said core members spaced away from any other core member;

d. introducing copper alloy matrix forming material into said cavity, and into spaces between and surrounding said core members;

e. maintaining said fixture containing said matrix forming material and said core members, under conditions in which said matrix forming material substantially fills all of said spaces between and surrounding said core members and said cavity, such that said core members are substantially fully surrounded by matrix forming material;

f. maintaining said fixture under conditions such that said matrix forming material becomes a unitary body surrounding said core members;

g. removing said unitary body and surrounded core members from said fixture; and h. pulling said core members out from said unitary body, said core members having been coated with a boron nitride core release coating before said step of introducing matrix forming material, said core release coating having been selected to prevent bonding of said unitary body formed from matrix forming material to said core members, whereby a channel remains where each of said removed core members had been arranged.

45. A method for fabricating an article having passages therethrough, the method comprising the steps of:

a. providing a fixture that defines a cavity;

b. providing a plurality of elongated, nickel, chromium and iron alloy core members;

c. arranging said core members in said cavity in a pattern having each of said core members spaced away from any other core member;

d. introducing titanium matrix forming material into said cavity, and into spaces between and surrounding said core members;

e. maintaining said fixture containing said matrix forming material and said core members, under conditions in which said matrix forming material substantially fills all of said spaces between and surrounding said core members and said cavity, such that said core members are substantially fully surrounded by matrix forming material;

f. maintaining said fixture under conditions such that said matrix forming material becomes a unitary body surrounding said core members;

g. removing said unitary body and surrounded core members from said fixture; and h. pulling said core members out from said unitary body, said core members having been coated with a titanium dioxide core release coating before said step of introducing matrix forming material, said core release coating having been selected to prevent bonding of said unitary body formed from matrix forming material to said core members, whereby a channel remains where each of said removed core members had been arranged.

46. A method for fabricating an article having passages therethrough, the method comprising the steps of:

a. providing a fixture that defines a cavity;

b. providing a plurality of elongated, steel core members;

c. arranging said core members in said cavity in a pattern having each of said core members spaced away from any other core member;

d. introducing aluminum matrix forming material into said cavity, and into spaces between and surrounding said core members;

e. maintaining said fixture containing said matrix forming material and said core members, under conditions in which said matrix forming material substantially fills all of said spaces between and surrounding said core members and said cavity, such that said core members are substantially fully surrounded by matrix forming material;

f. maintaining said fixture under conditions such that said matrix forming material becomes a unitary body surrounding said core members;

g. removing said unitary body and surrounded core members from said fixture; and h. pulling said core members out from said unitary body, said core members having been coated with a carbon core release coating before said step of introducing matrix forming material, said core release coating having been selected to prevent bonding of said unitary body formed from matrix forming material to said core members, whereby a channel remains where each of said removed core members had been arranged.

47. A method for fabricating an article having passages therethrough, the method comprising the steps of:

a. providing a fixture that defines a cavity;

b. providing a plurality of elongated, steel core members;

c. arranging said core members in said cavity in a pattern having each of said core members spaced away from any other core member;

d. introducing aluminum matrix forming material into said cavity, and into spaces between and surrounding said core members;

e. maintaining said fixture containing said matrix forming material and said core members, under conditions in which said matrix forming material substantially fills all of said spaces between and surrounding said core members and said cavity, such that said core members are substantially fully surrounded by matrix forming material;

f. maintaining said fixture under conditions such that said matrix forming material becomes a unitary body surrounding said core members;

g. removing said unitary body and surrounded core members from said fixture; and h. pulling said core members out from said unitary body, said core members having been coated with a molybdenum disulfide core release coating before said step of introducing matrix forming material, said core release coating having been selected to prevent bonding of said unitary body formed from matrix forming material to said core members, whereby a channel remains where each of said removed core members had been arranged.

48. A method for fabricating an article having passages therethrough, the method comprising the steps of:

a. providing a fixture that defines a cavity;

b. providing a plurality of elongated, molybdenum core members;

c. arranging said core members in said cavity in a pattern having each of said core members spaced away from any other core member;

d. introducing steel matrix forming material into said cavity, and into spaces between and surrounding said core members;

e. maintaining said fixture containing said matrix forming material and said core members, under conditions in which said matrix forming material substantially fills all of said spaces between and surrounding said core members and said cavity, such that said core members are substantially fully surrounded by matrix forming material;

f. maintaining said fixture under conditions such that said matrix forming material becomes a unitary body surrounding said core members;

g. removing said unitary body and surrounded core members from said fixture; and h. pulling said core members out from said unitary body, said core members having been coated with a boron nitride core release coating before said step of introducing matrix forming material, said core release coating having been selected to prevent bonding of said unitary body formed from matrix forming material to said core members, whereby a channel remains where each of said removed core members had been arranged.

* * * * *